US006537087B2

(12) United States Patent
McNamara et al.

(10) Patent No.: US 6,537,087 B2
(45) Date of Patent: Mar. 25, 2003

(54) ELECTRICAL CONNECTOR

(75) Inventors: David M. McNamara, Amherst, NH (US); Edward Gerald Marvin, New Castle, NH (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/056,881

(22) Filed: Jan. 25, 2002

(65) Prior Publication Data

US 2002/0098727 A1 Jul. 25, 2002

Related U.S. Application Data

(62) Division of application No. 09/198,422, filed on Nov. 24, 1998.

(51) Int. Cl.[7] .............................................. H01R 13/648
(52) U.S. Cl. ...................................... 439/108; 439/608
(58) Field of Search ................................ 439/108, 684, 439/688, 701, 101, 607, 610, 74

(56) References Cited

U.S. PATENT DOCUMENTS

| 4,971,565 A | * | 11/1990 | Fox, Jr. ........................ 439/74 |
| 5,716,237 A | * | 2/1998 | Conorich et al. ........... 439/660 |
| 5,795,191 A | * | 8/1998 | Preputnick et al. ......... 439/608 |
| 5,813,871 A | * | 9/1998 | Grabbe et al. ............... 439/108 |
| 5,860,816 A | * | 1/1999 | Provencher et al. .......... 439/79 |
| 5,915,975 A | * | 6/1999 | McGrath ...................... 439/74 |
| 6,048,213 A | * | 4/2000 | Lai et al. ..................... 439/74 |

* cited by examiner

Primary Examiner—Tulsidas Patel
(74) Attorney, Agent, or Firm—David H. Hwang

(57) ABSTRACT

An electrical connector having a plurality of electrical conductors with one portion thereof disposed in a housing and an end of such connector projecting outward from the housing and terminating in a pad disposed perpendicular to the housing disposed portion. The connector is provided adapted for mounting to an ball grid array disposed on a printed circuit board. The pad is coupled to the conductor through a curved interconnect. The interconnect is configured as an inductor to provide a series resonant circuit element for the capacitor effect provided by the pad. The connector has a housing adapted to having therein a plurality of wafer-like modules. Each one of the modules has a dielectric support and an array of signal electrical conductors electrically insulated by portions of the supports. A ground plane electrical conductor is provided. The ground plane conductor is disposed under, and is separated from, portions of the signal electrical conductor by the dielectric member. The signal conductor, ground plane conductor and portion of the dielectric support member therebetween are configured as a microstrip transmission line having a predetermined impedance.

15 Claims, 20 Drawing Sheets

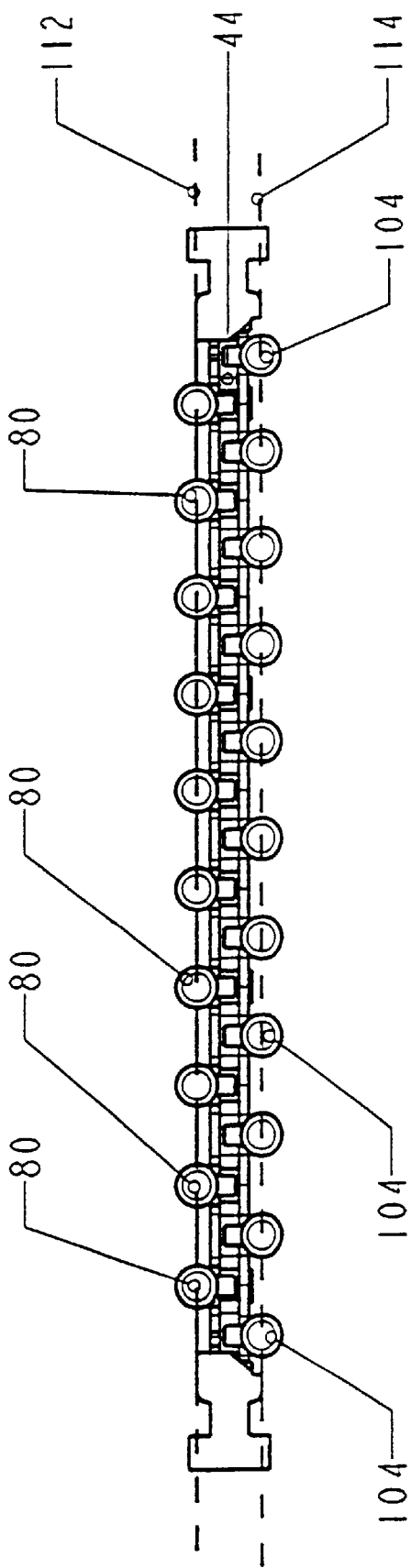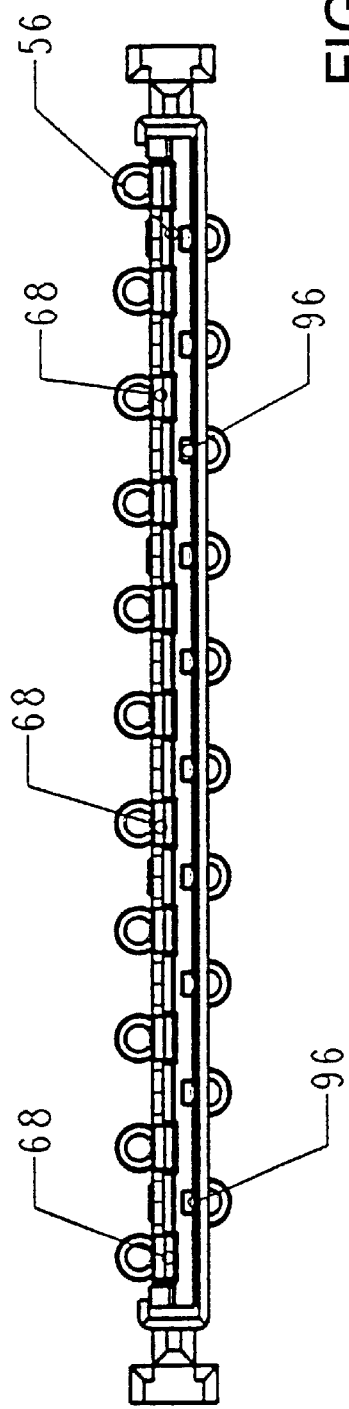

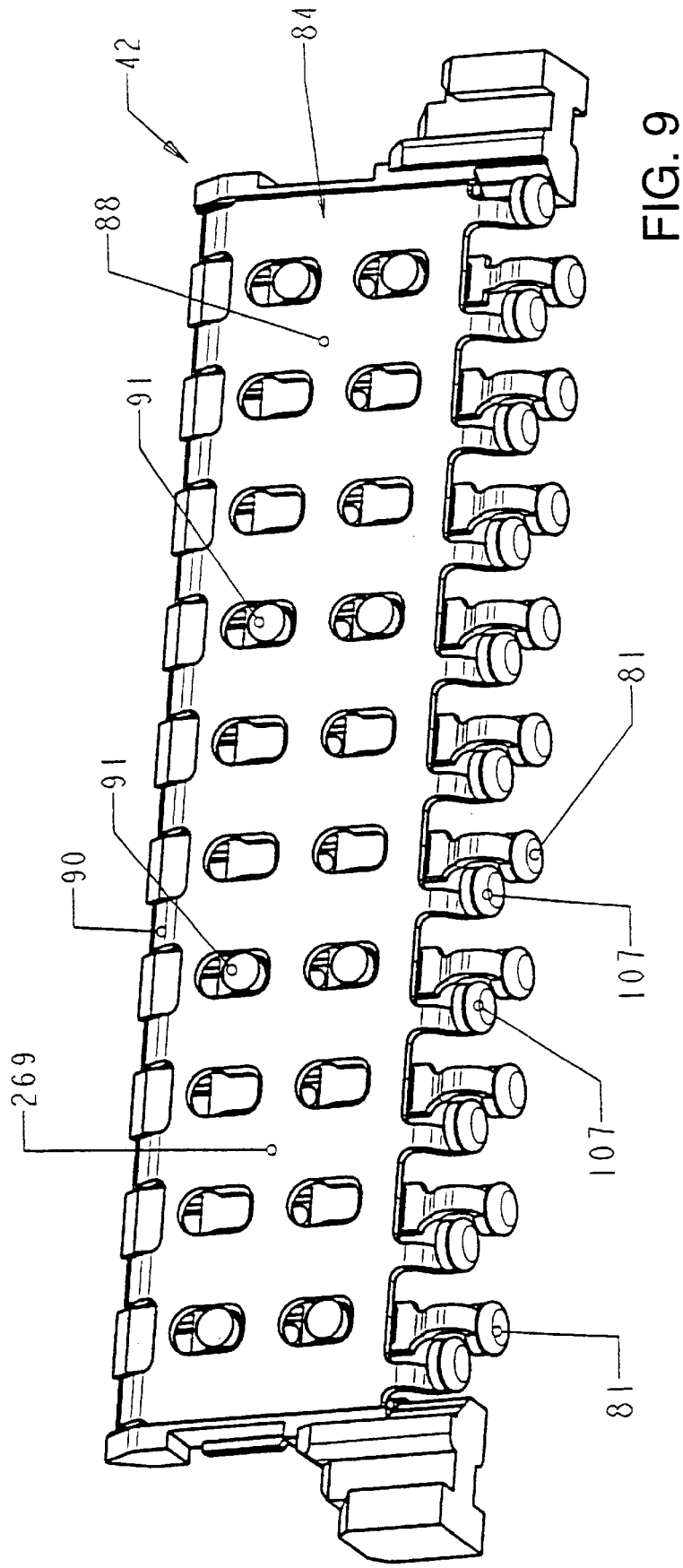

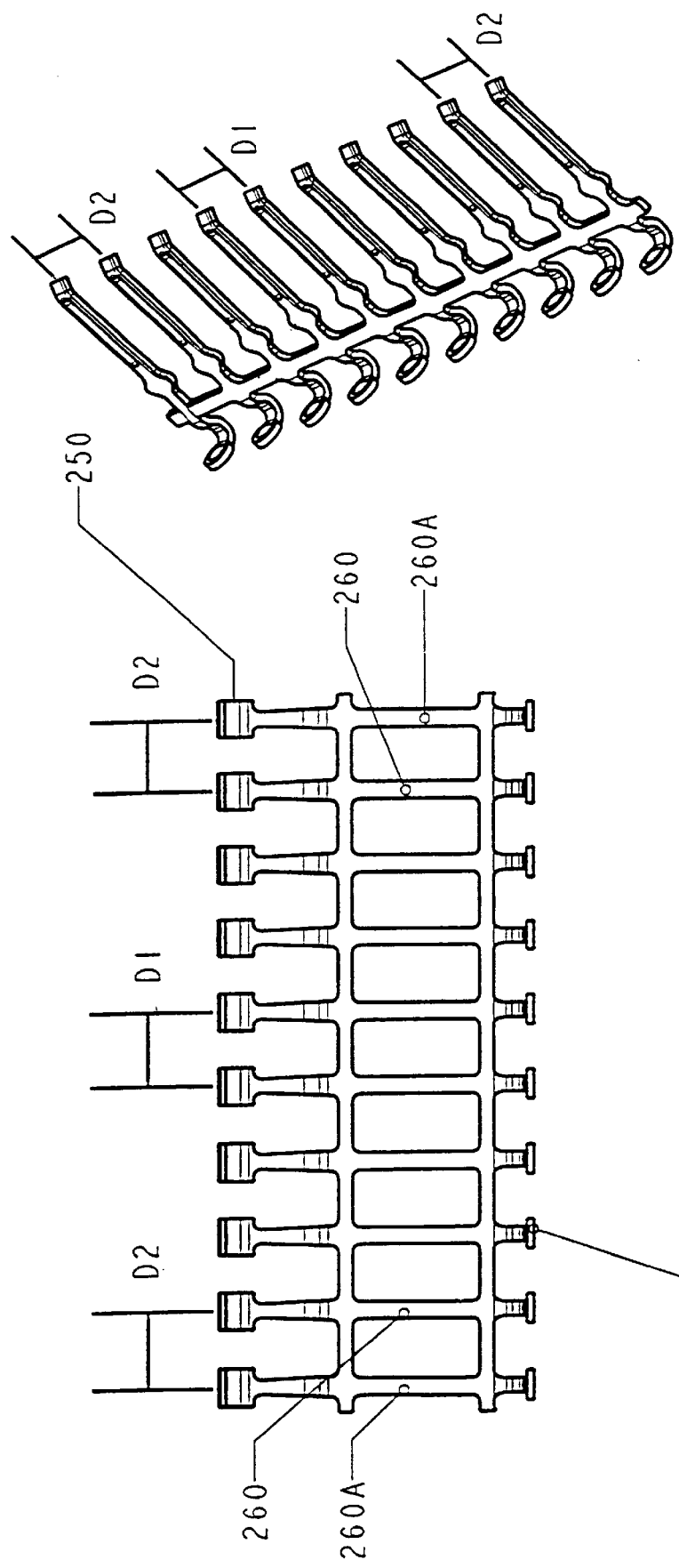

ELECTRICAL CONNECTOR

CROSS REFERENCE TO RELATED APPLICATIONS

This application is a divisional of U.S. patent application Ser. No. 09/198,422 filed Nov. 24, 1998, entitled "ELECTRICAL CONNECTOR".

BACKGROUND OF THE INVENTION

This invention relates generally to electrical connectors and more particular to very high density electrical connectors adapted for use with printed circuit boards.

As is known in the art, electrical connectors of the type used with printed circuit boards are becoming smaller and are required to operate with data signals having extremely short edge rise times. Further, such connectors must be mechanically robust and configured to enable relatively low manufacturing cost.

SUMMARY OF THE INVENTION

In accordance with one feature of the invention, an electrical connector is provided having a plurality of electrical conductors with portions thereof disposed in a housing and ends thereof terminating in pads oriented perpendicular to the housing disposed portions of the conductors.

In a preferred embodiment, solder balls are disposed on the pads to facilitate mounting to a printed circuit board.

In accordance with another feature of the invention, the pad is coupled to the conductor through a curved interconnect. The interconnect is configured as an inductor to provide a series resonant circuit element for capacitance provided by the pad and attachment to the printed circuit board.

In accordance with another feature of the invention, an electrical connector is provided having a housing adapted to have therein a plurality of wafer-like modules. Each one of the modules has a dielectric support and an array of signal electrical conductors electrically insulated one from another by portions of the support. A ground plane electrical conductor is provided. The ground plane conductor is disposed under, and is separated from, portions of the signal electrical conductor by the dielectric member. The signal conductor, ground plane conductor, and portion of the dielectric support member therebetween are configured as a microstrip transmission line having a predetermined impedance.

With such an arrangement, the microstrip transmission line extends along a length of the connector in a region between an overlaying pair of printed circuit boards. Thus, the microstrip transmission line in the connector appears the same as, i.e., is matched to, the transmission line in the printed circuit board. Therefore, once the connector is designed, the length of the microstrip transmission line can be readily extended to similar connectors having different lengths to accommodated different height separation requirements between the overlying printed circuit boards.

BRIEF DESCRIPTION OF THE DRAWING

These and other feature of the invention, as well as the invention itself, will become more readily apparent from the following detailed description when read together with the following drawings, in which:

FIG. 5A is a diagrammatic sketch showing the arrangement of proximal ends of electrical conductors of the module of FIG. 4;

FIG. 5B is a diagrammatic sketch showing the arrangement of mounting pads of the module of FIG. 4;

FIG. 9 is a different perspective view of the module of FIG. 4;

FIGS. 19A and 19B are alternative embodiments of the signal lead frame shown in FIGS. 7 and 15A.

DESCRIPTION OF THE PREFERRED EMBODIMENTS

Figure 1:
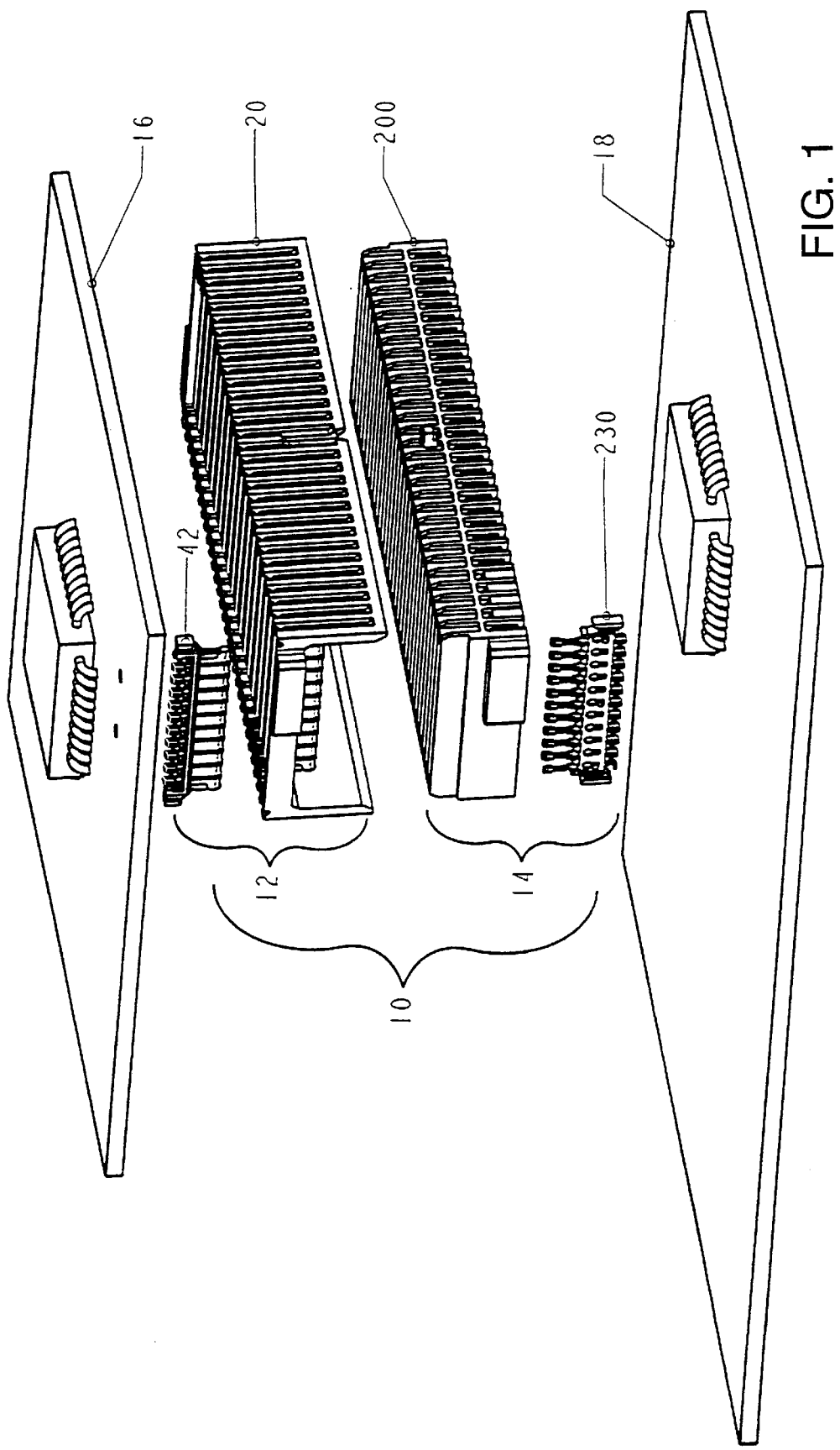
FIG. 1 is an exploded sketch of a pair of overlying printed circuit boards electrically interconnected by a connector assembly according to the invention.
Figure 2:
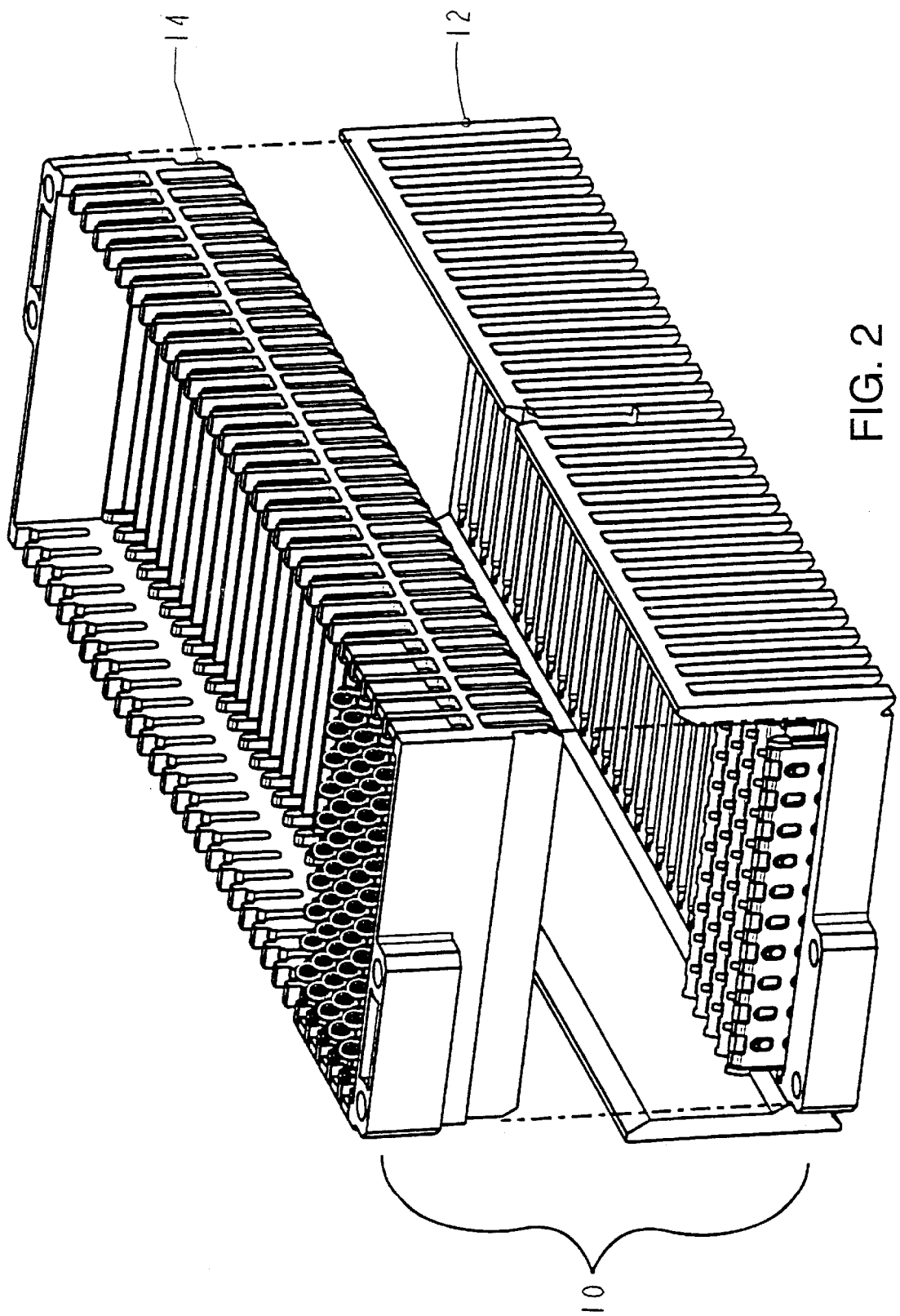
FIG. 2 is a perspective, exploded drawing of one of a pair connectors of the connector assembly of FIG. 1.

Referring now to FIGS. 1 and 2, an electrical connector assembly 10 is shown. The assembly 10 includes a pair of molded electrical connectors 12, 14. One of the electrical connectors, here connector 12, is adapted for mounting to a first printed circuit board 16 and the other electrical connector 14 is adapted for mounting to a second printed circuit board 18 positioned parallel to, here below, the first printed circuit board 12.

Figure 3:
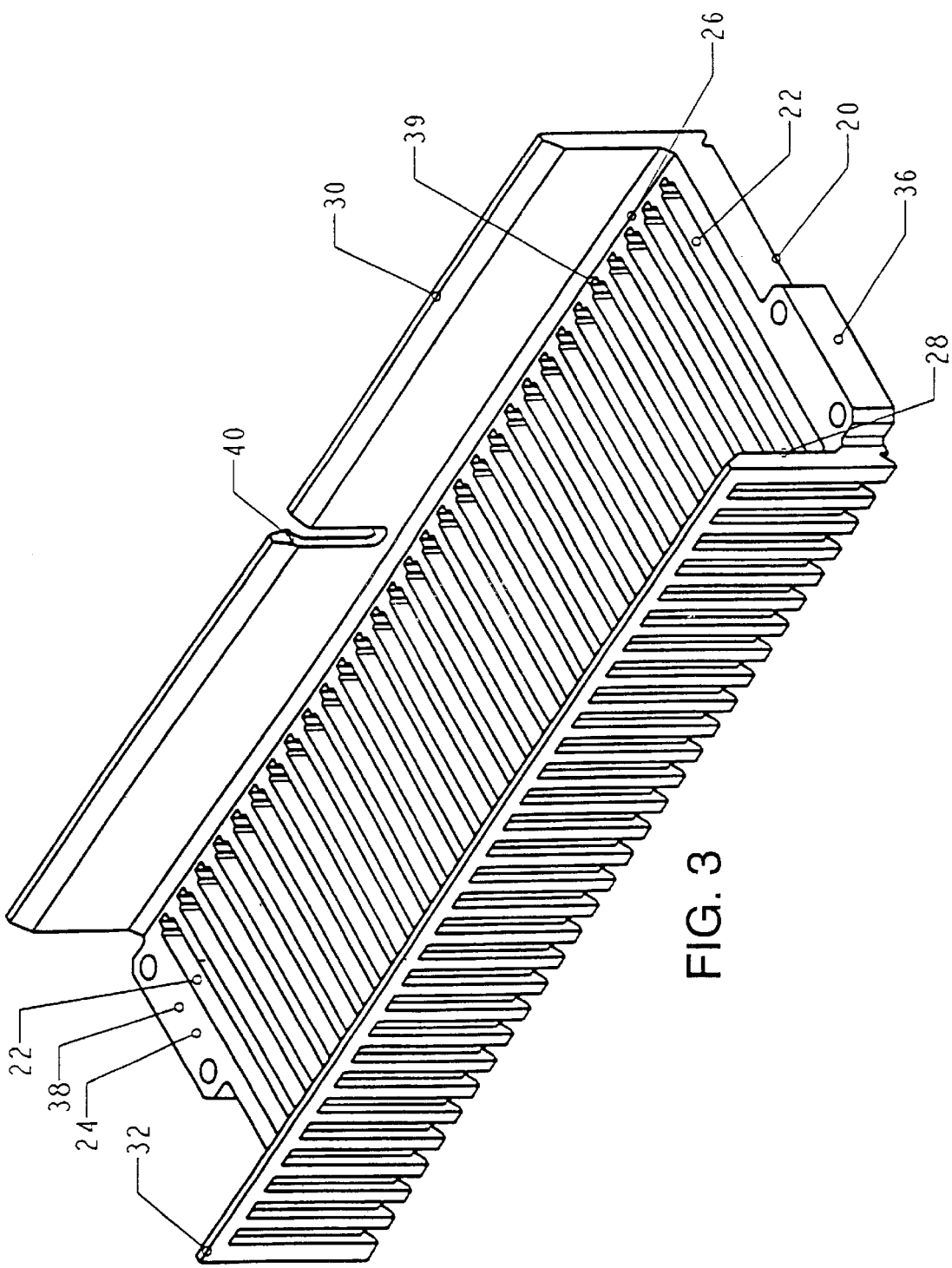
FIG. 3 is a perspective drawing of a housing of the connector of FIG. 2.

Referring now also to FIG. 3, connector 12 includes a dielectric, here plastic, housing 20, here a shroud, having a plurality of parallel slots 22 formed in an upper surface 24 thereof. The slots 22 extend between opposing sides 26, 28 of the housing 20. The housing 20 has a pair of opposing sidearms 30, 32 extending from the opposing sides 26, 28 in planes perpendicular to the slots 22. Housing 20 has disposed in an undersurface thereof a plurality of grooves 39. Each one of the grooves 39 is aligned with a corresponding one of the slots 22 providing for each one of the slots 22 an opposing, aligned pair of the grooves 39. The housing 20 has a pair of diagonally opposing mounting flanges 36, 38, each having a pair of holes therein for screws or pins, not shown, which may be used to fasten and align the housing to printed circuit board 16 (FIG. 1). The sidewall 30 has a slot 40 for enabling the housing 20 to key with a post, to be described, in the housing of connector 14.

Figure 4:
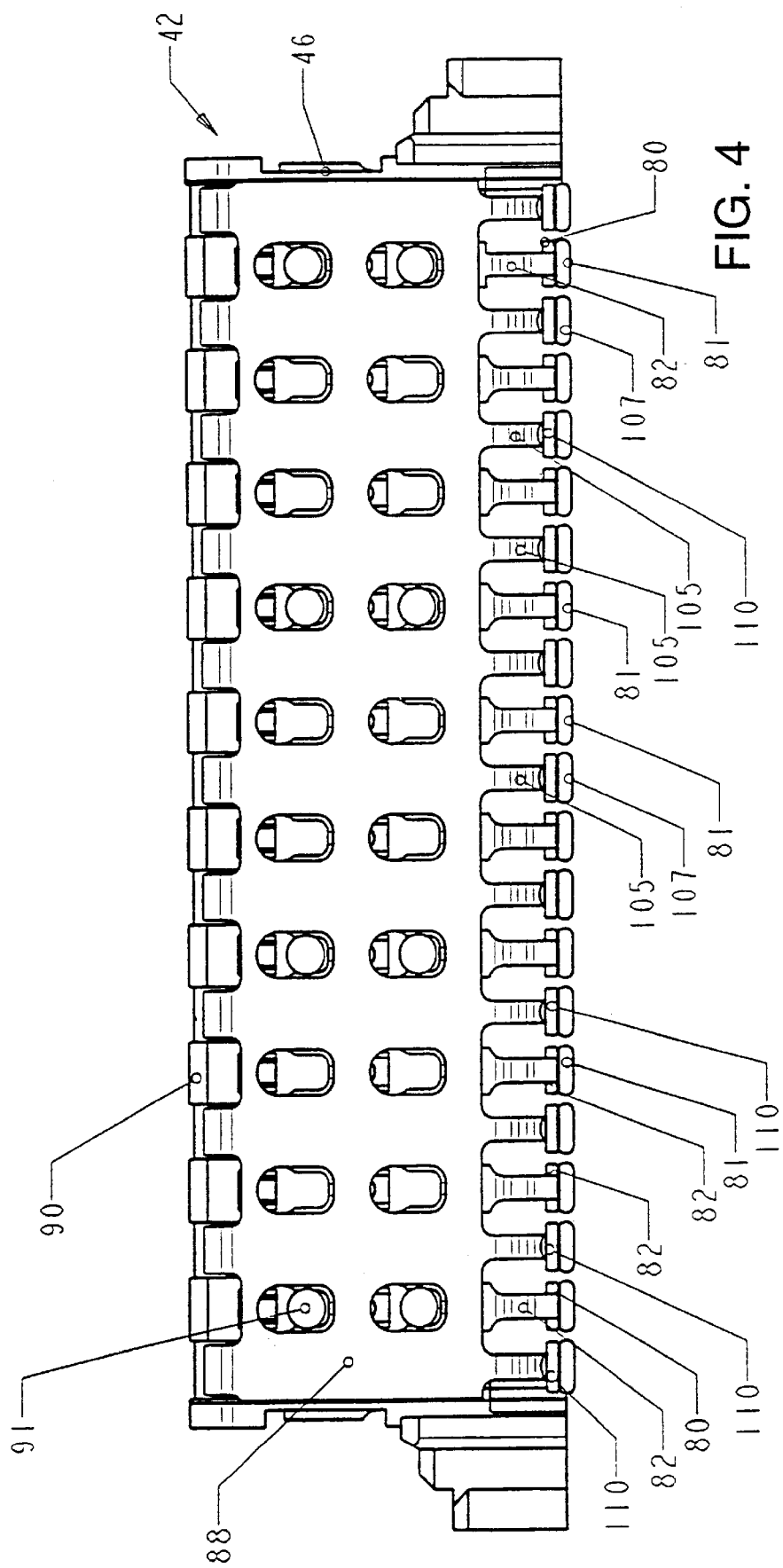
FIG. 4 is a top view of a module used in the connector of FIG. 2.
Figure 5:
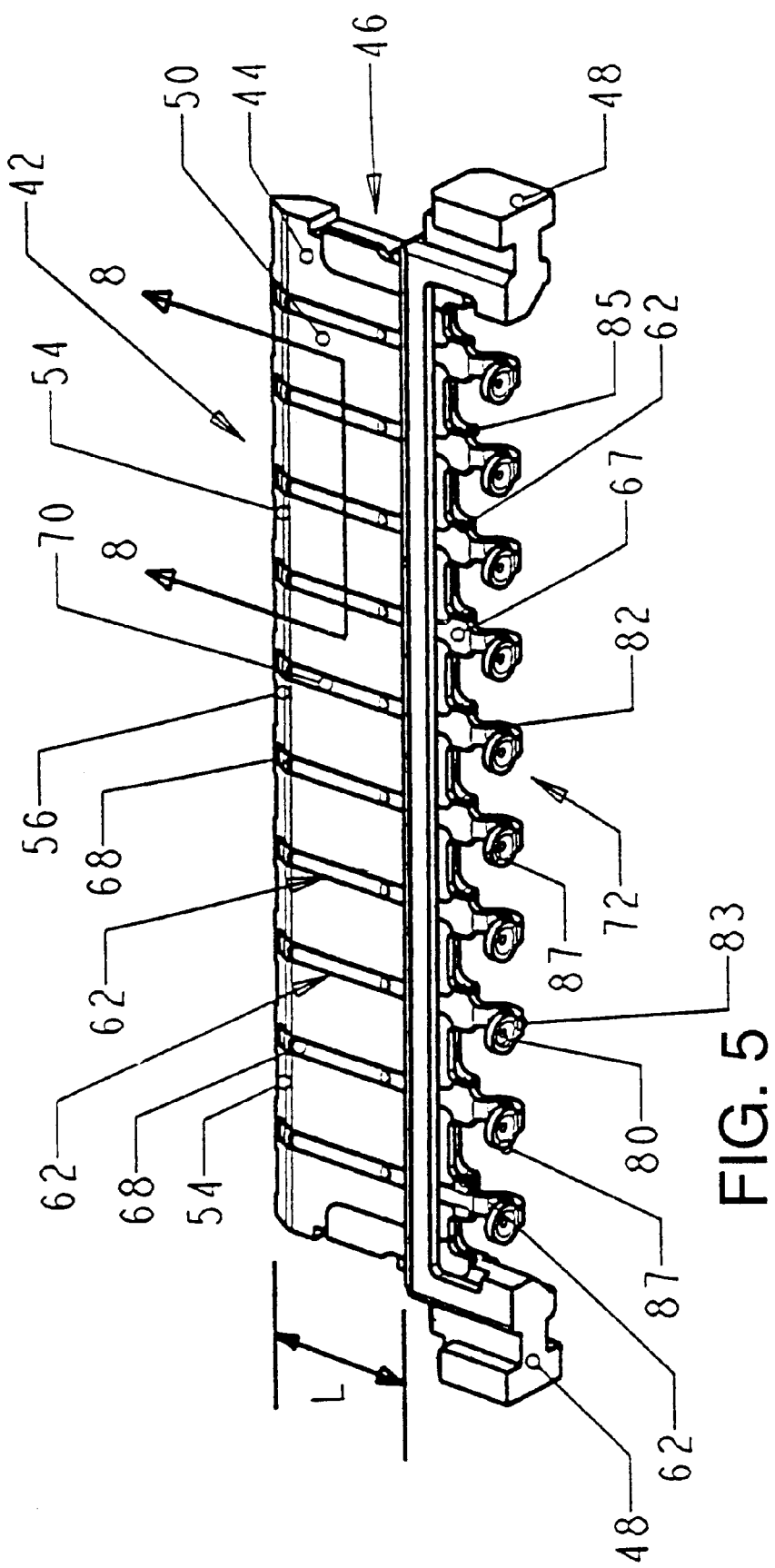
FIG. 5 is a perspective view of the module of FIG. 4.
Figure 6:
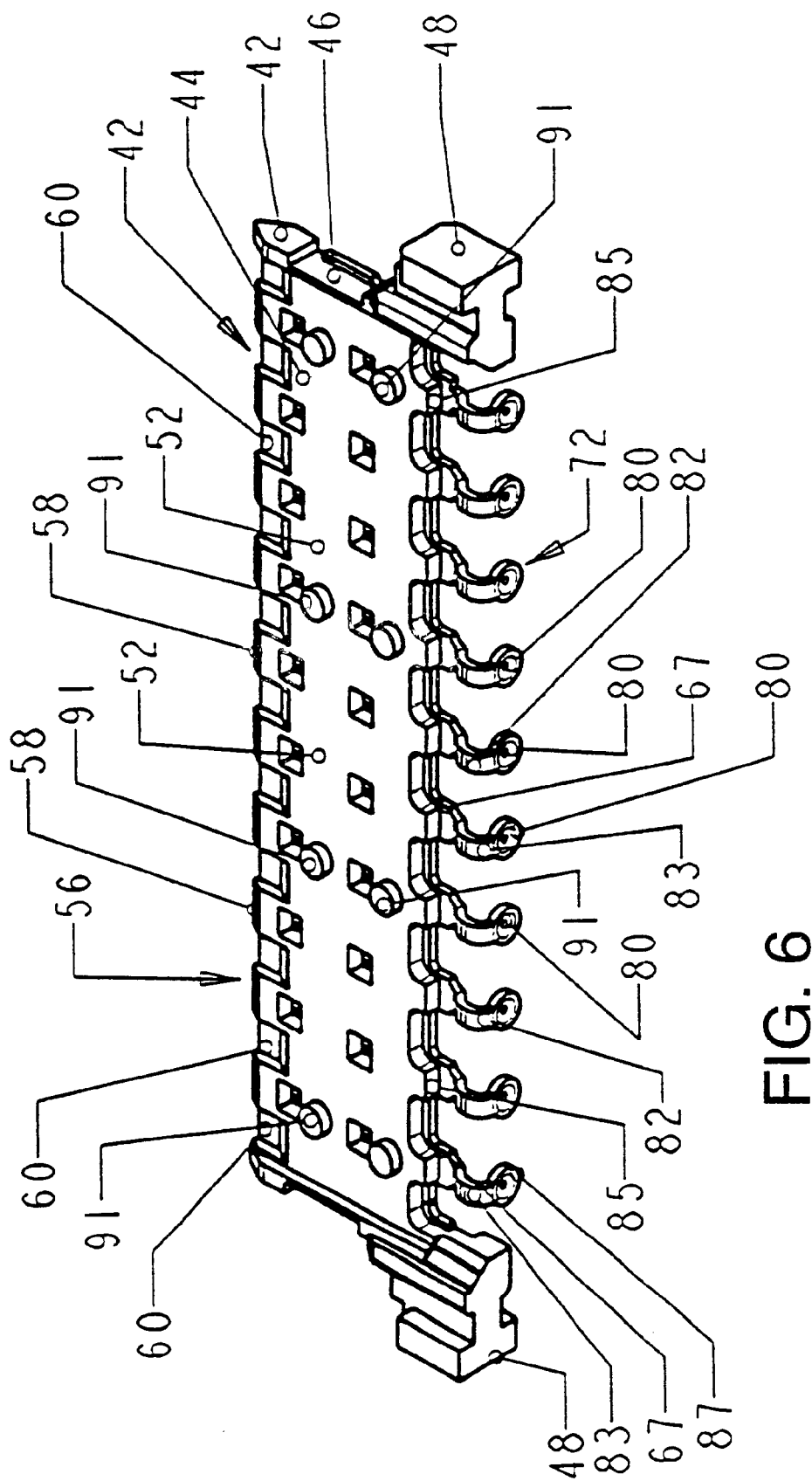
FIG. 6 is a different perspective view of the module of FIG. 4 with a shielding member thereof removed.

Referring again to FIG. 1, the connector 12 includes a plurality of wafer-like modules 42 (sometimes referred to herein as merely wafers). Each one of the modules 42 is configured to be received in a corresponding one of the slots 22 (FIG. 3). In the preferred embodiment, each one of the modules 42 is identical in construction, an exemplary one thereof being shown in FIG. 4. Each one of such modules 42 includes a dielectric support 44, shown more clearly in FIGS. 5 and 6. The dielectric support 44 has a forward portion 46 and a pair of rearward, shoulder end portions 48. The forward portion 46 is adapted in to inserted into a corresponding one of the slots 22. The shoulder end portions 48 are configured to slide within a corresponding opposing pair of the grooves 39 (FIG. 3). The forward portion 46 of the dielectric support 44 has substantially planar opposing surface portions 50, 52, as shown in FIGS. 5 and 6, respectively. The surface portion 50 terminates along a beveled portion 54 disposed along a forward edge 56 of the dielectric support 44. The surface portion 52 (FIG. 6) terminates along bevelled portions 58 interleaved with recesses 60 along the forward edge 56 of the dielectric support 44 to provide the support 44 with a spaced V-shaped forward edge 56.

Figure 7:
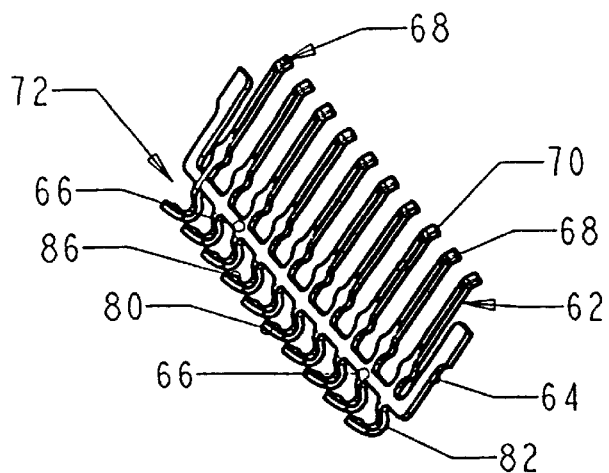
FIG. 7 is a perspective view of a lead frame having a plurality of electrical signal conductors used in the module of FIG. 4.
Figure 8:
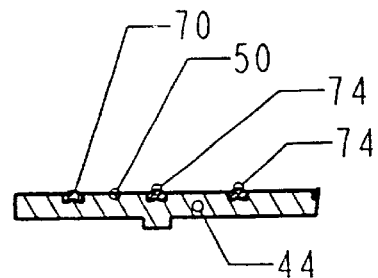
FIG. 8 is a cross-sectional sketch of a portion of the module of FIG. 4.

The module 42 includes a plurality of signal electrical conductors 62 disposed in a linear array. More particularly, the signal conductors 62 are provided in a copper lead frame 64 (FIG. 7). The lead frame 64 is insert molded into the dielectric support 44, as shown in FIG. 5. When assembled, portions 66 of the lead frame 64, which are connected between the adjacent conductors 62, are cut away along edges 67 (FIGS. 5 and 6) to provide electrically isolated conductors 62, as shown in FIG. 5. Each one of such signal electrical conductors 62 has: a forward, beveled proximal end 68 (FIGS. 5 and 7) disposed along the forward edge 56 of the surface portion 50; and an elongated intermediate portion 70 connected between the proximal end 68 and a rearward, distal end 72 of the conductor 62. The intermediate portion 70 and the proximal end 68 are partially embedded within the surface portion 50. As noted above, the signal electrical conductors 62 are electrically insulated one from another by interposed portions of the surface portion 50. It is noted that central, elongated, upper portions 74 of the intermediate portion 70 are raised, as a rib-shaped structure, above the surface 50 of the dielectric support 44, as shown more clearly in FIG. 8. This raised structure can be formed by coining the edges of the signal electrical conductors 62 before they are molded into dielectric support 44.

The rearward, distal end 72 includes a signal mounting pad 80 and a curved, here an arch-shaped, interconnect 82 disposed between an edge 83 of the signal mounting pad 80 and the intermediate portion 70. The interconnect 82 is resilient and suspends the signal mounting pad 80 at the edge 83 thereof beyond a rearward edge 85 (FIGS. 5 and 6) of the surface portion 50 in a region between the pair of rearward shoulder end portions 48 and in a nominal orientation substantially perpendicular to the surface portion 50. An opposite edge 87 of the signal mounting pad 80 being freely suspended outwardly from the surface portion 50. The mounting pads 80 are adapted for soldering to pads, not shown, on the printed circuit board 16 (FIG. 1). It should be noted that the mounting pads may be considered as contact tails.) The pads 80 are configured to accept "solder spheres" 81 (FIG. 4) as on Ball Grid Array (BGA) packages. If desired, the spheres 81 can be placed on the pad 80, and then fused to the pad using a surface mount solder reflow process. The resulting structure is shown in FIG. 4.

Mounting pads 80 can be shaped to facilitate attachment of a solder ball. FIG. 7 shows pad 80 stamped with a dimple 86 in it. Dimple 86 leaves a bump on the upper surface of the pad but creates a concave lower surface. The concave surface forces the solder ball into the center of pad 80 during reflow. Positional accuracy of the solder ball is enhanced before the connector is attached to the printed circuit board. A similar result can be obtained by forming a hole in the pad 80.

Figure 11:
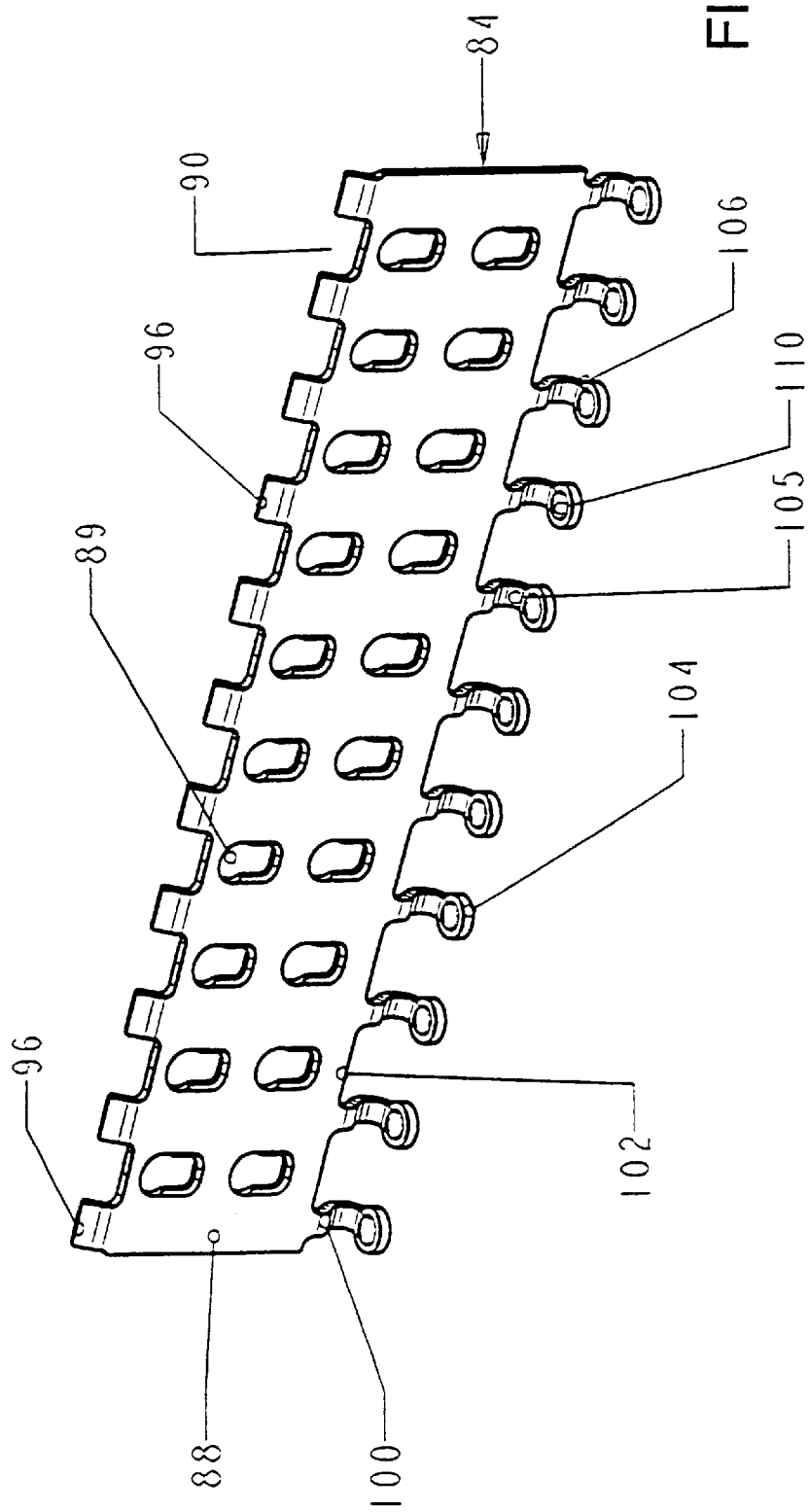
FIG. 11 is a perspective view of the shielding member of the module of FIG. 4.

Disposed on the surface portion 52 (FIG. 6) of the dielectric support 44 is an electrical shielding member 84 as shown in FIG. 11. The shield member 84 is copper and stamped as shown in FIG. 11. The shielding member 84 includes a central region 88. The central region 88 has holes 89 stamped therein and such holes 89 are press-fit onto posts 91 molded, and projecting outwardly from, the surface portion 50, as shown in FIG. 6.

The shielding member 84 has a forward plurality of openings 89 through which portion 58 (FIG. 6) of dielectric support 44 may project. Beveled portion 58 is insulative material backing the signal electrical conductors 68 thereby ensuring shield member 84 is not shorted to signal electrical conductors 68. Shielding member 84 has a beveled distal end 96 disposed in the recesses 60 (FIG. 6) along the forward edge 56 of the surface portion 52.

Figure 10:
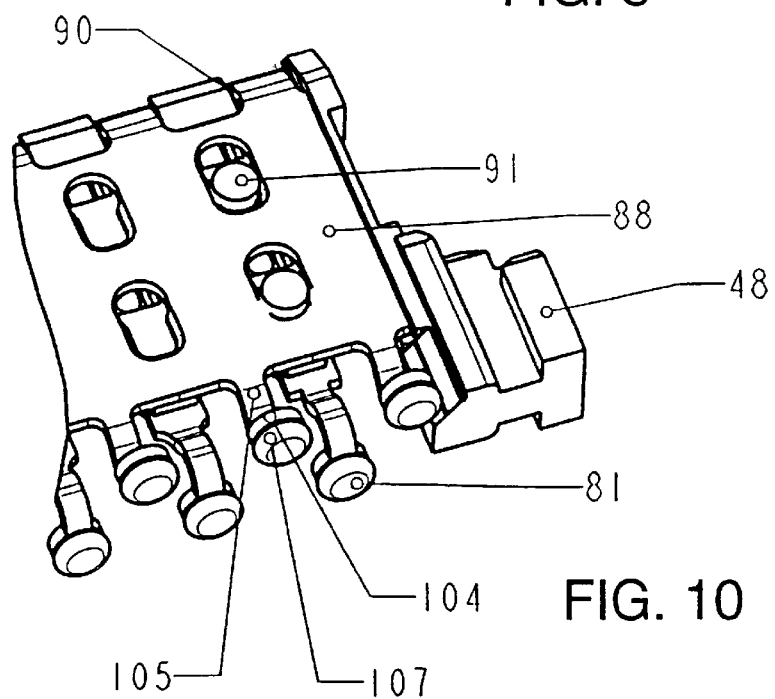
FIG. 10 is an exploded, perspective view of a portion of the module of FIG. 4.
Figure 16:
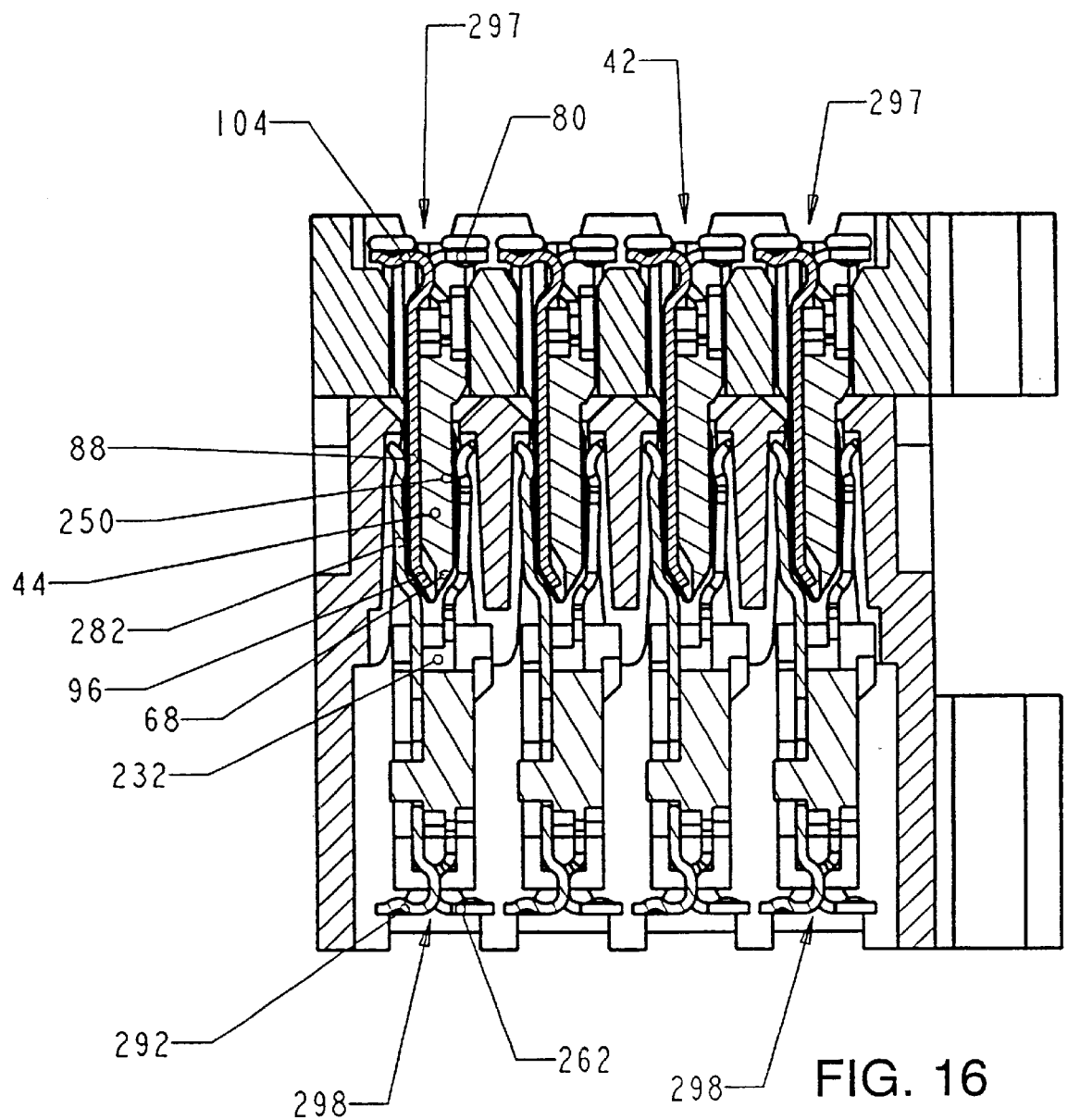
FIG. 16 is a cross-sectional drawing of the connector assembly of FIG. 1.

The shielding member 84 also includes a rearward plurality of electrical reference potential conductors 98 (FIG. 11) having: proximal ends 100 terminating along a rearward edge 102 of central region 88; reference potential mounting pads 104; and reference potential arch-shaped interconnects 105 disposed between an edge 106 of the reference potential mounting pads 104 and the rearward edge 102 of the central region 88. The reference potential arch-shaped interconnects 105, like interconnects 82, are resilient and suspend the reference potential mounting pads 104 at the edges 106 thereof beyond a rearward edge of the surface portion 52 in a region between the pair of shoulder end portions 48 and in a nominal orientation substantially perpendicular to the surface portion 52 with an opposite edge 110 of the reference potential mounting pad 104 being freely-suspended outward from the surface portion 52. Thus, it is noted that the reference potential mounting pads 104 are freely suspended outward from the second surface portion 52 in a direction opposite to a direction of the suspended signal mounting pad 80 as shown in FIGS. 10 and 16. The mounting pads 104, like pads 80, are adapted for soldering to surface mounting pads 300, 302 (FIGS. 17, 18) on the printed circuit board 16 (FIG. 1). The pads 104, like pads 80, are configured to accept "solder spheres" 107 (FIGS. 4, 9, and 10) as on Ball Grid Array (BGA) packages. If desired, the spheres can be placed on the pad 104, and then fused to the pad using a surface mount solder reflow process. The resulting structure is shown in FIGS. 4 and 10.

It should be noted that the pads 104 do not extend below the lower edge of shoulders 48. Thus, when a wafer is mounted on a board, pads 204 (FIG. 12A) will be held above the surface of the board. The area below pad 104 will be filled with solder-forming a solder joint. Thus, mating forces are shared by the housing and the solder joints.

Referring also to FIG. 5B, the plurality of signal mounting pads 80 are disposed along a line 112 parallel to the rearward edge 85 of the dielectric support 44. The plurality of reference potential mounting pads 104 are disposed along a line 114 parallel to the rearward edge 85, the lines 112, 114 being disposed on opposite sides of the dielectric support 44. Further, the reference potential mounting pads 104 are staggered with the signal mounting pads 80 along the rearward edge 85 of the dielectric support 44.

Referring to again to FIG. 8, it should be noted that the conductive region 88, the elongated intermediate portions 70 of signal conductors 62 and the dielectric member 44 disposed therebetween are configured as microstrip transmission lines having a predetermined input impedance matched to the impedance of the printed circuit board 16, here an input impedance of 50 ohms. It is also noted that the length, L, (FIG. 5) of the transmission lines is easily extendable when longer modules are desired as for applications requiring greater height separation between the printed circuit boards 16, 18, FIG. 1. That is, the separation between boards 16, 18 is, in some applications, a function of the heat flow requirements between the boards 16, 18. Thus, once the microstrip transmission line configuration is established other modules of greater or lesser length, L, may be easily designed while maintaining the same desired input impedance. In preferred embodiments, the length is between 10 and 30 mm.

It should also be noted that the arch-shaped interconnects 82, 105 are configured to provide an inductor. The pads 80, 104, are here circular, or semi-circular shaped. These pads are attached to signal launches on a printed circuit board. The resulting interconnection will have a capacitive reactance. To counter-balance this capacitance the shape of the interconnects 82, 105 is selected to configure the interconnects 82, 105 as an inductor. Thus, the inductance of the interconnect 82, 105 and the capacitor of the pad 80, 104 are serially connected and configured to provide a series resonant circuit with the result that a signal on one printed circuit board propagates through the series resonant circuit to the strip transmission line described above. As will be seen, the other connector 14 is configured in a like manner so that the signal passes through an impedance matched microstrip transmission line therein and then through a similar series resonant circuit thereof.

Figure 12A:
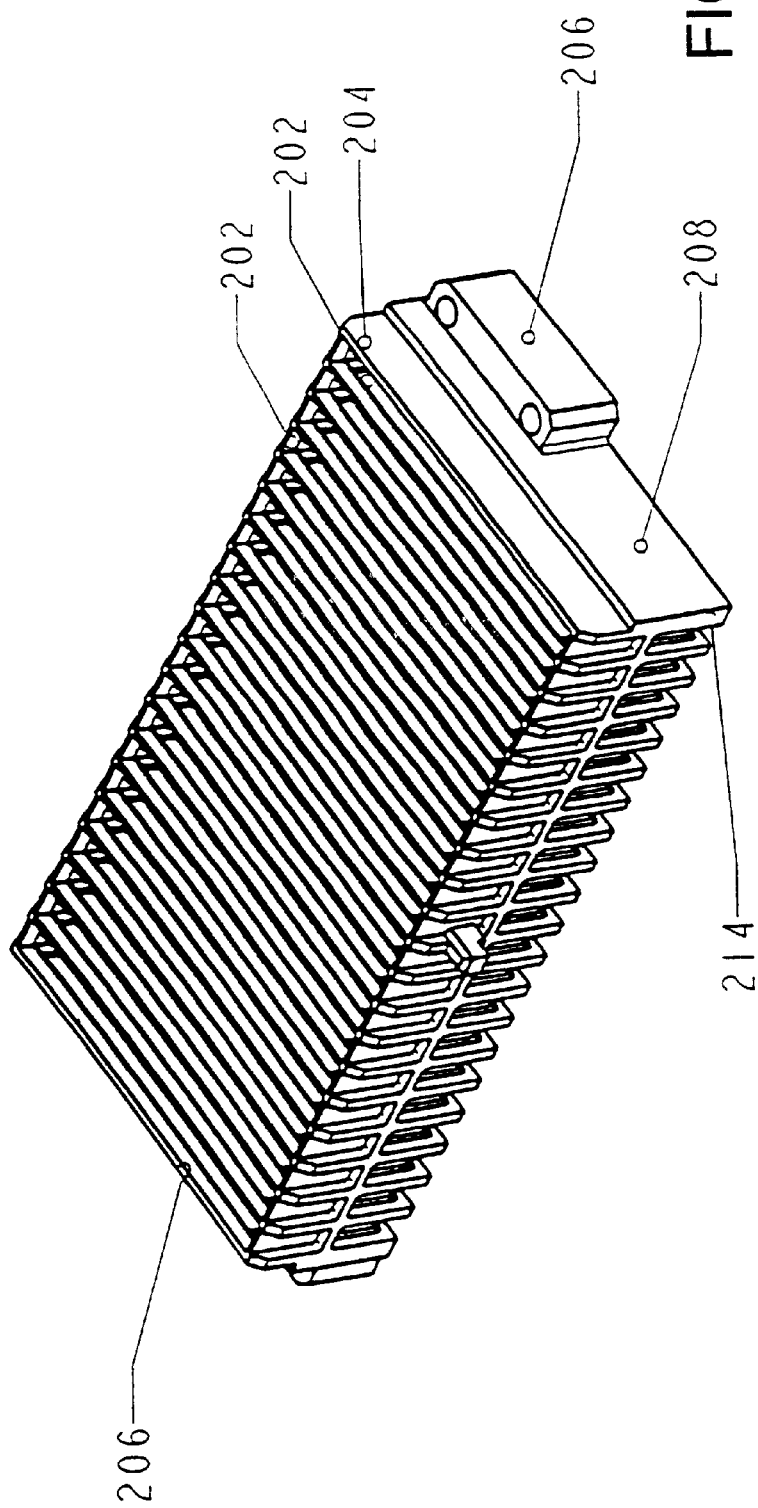
FIGS. 12A and 12B are different perspective drawings of a housing of the other one of the connectors of the connector assembly of FIG. 1.
Figure 12B:
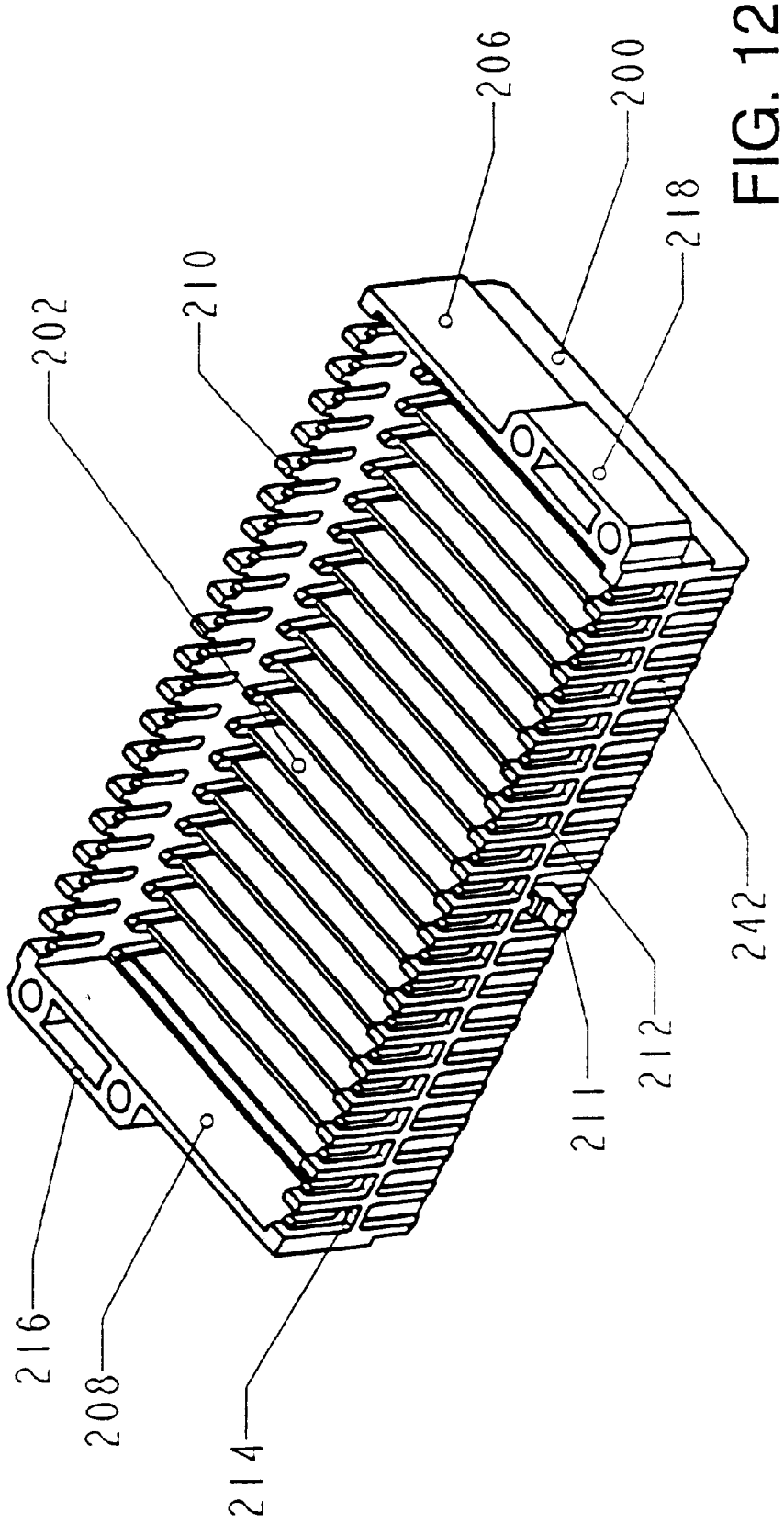

Referring again to FIG. 1, the connector 14 includes a dielectric, here plastic, housing 200. Referring also to FIGS. 12A and 12B, the housing 200 has a plurality of parallel slots 202 formed in an upper surface 204 thereof. The slots 202 extend longitudinally between opposing sides 206, 208 of the housing 200. The housing 200 has a pair of opposing sidearms 210, 212 extending from the opposing sides 206, 208 in planes perpendicular to the slots 202. Each one of the sidearms 210, 212 has disposed in surface portions thereof a plurality of grooves 214. Each one of the grooves 214 in each one of the sidearms 210, 212 is aligned with a corresponding one of the slots 202 providing for each one of the slots 202 an opposing, aligned pair of the grooves 214. The housing 202 has a pair of diagonally opposing mounting flanges 216, 218, each having a pair of holes therein for screws, or pins, not shown, which may be used to fasten or align the housing 200 to printed circuit board 18, FIG. 1. The sidewall 210 has a post 211 for enabling the housing 200 to key with the slot 40 (FIG. 3) in the sidearm 30 of housing 20.

Figure 13:
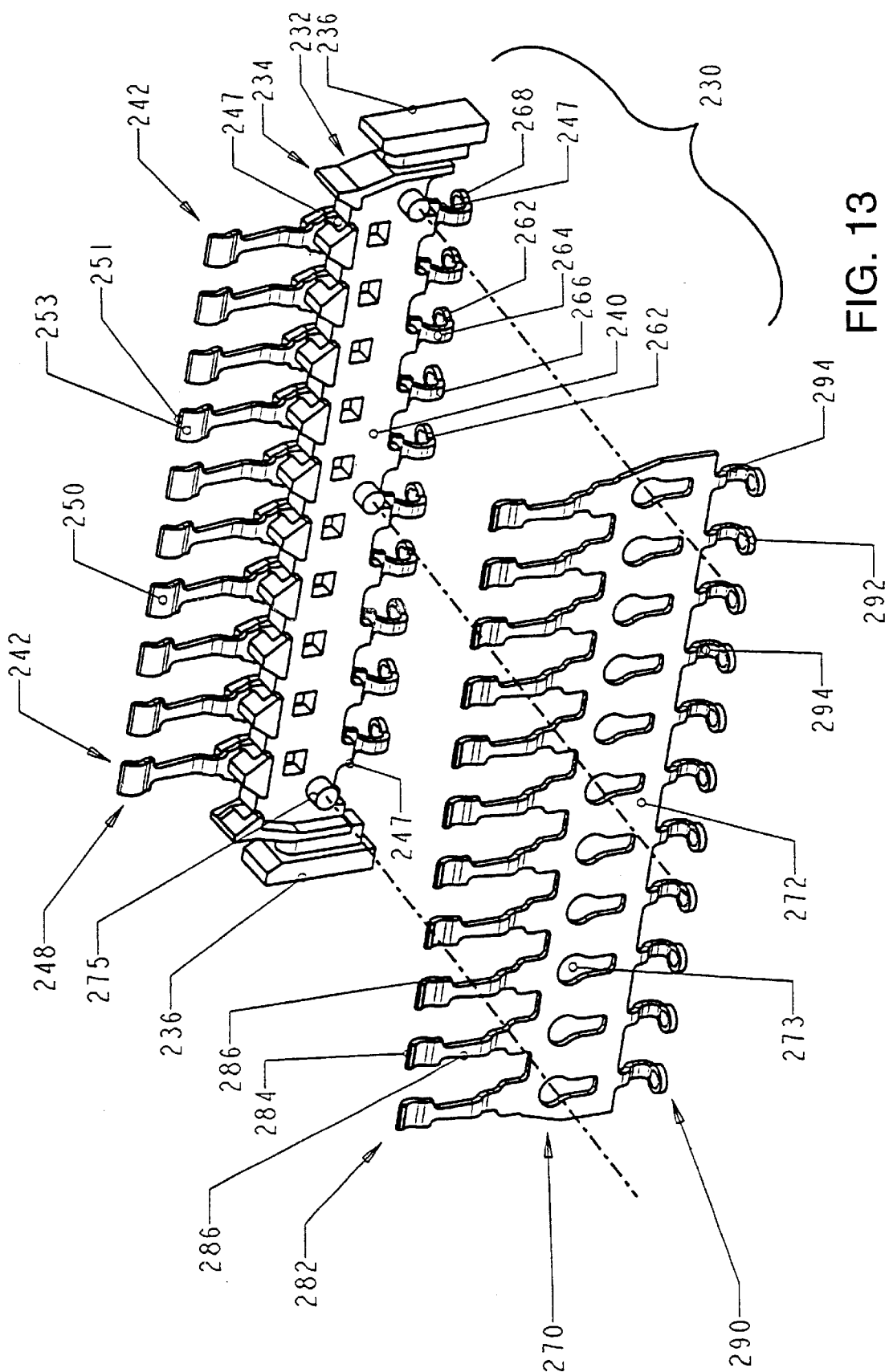
FIG. 13 is an exploded, perspective view of a module used in the connector of FIG. 1.

Referring now also to FIG. 1, the connector 14 includes a plurality of wafer-like modules 230 (sometimes referred to herein as merely wafers). Each one of the modules 230 is identical in construction and is configured to be received in a corresponding one of the slots 202. An exemplary one of the modules 230 is shown in FIG. 13. Each one of the modules 230 includes a dielectric support 232 having a forward portion 234 and a pair of rearward, shoulder end portions 236. The end portions 236 are configured to slide within a corresponding opposing pair of the grooves 214 (FIGS. 12A and 12B). The forward portion 234 has substantially planar first and second opposing surfaces 240, shown in FIG. 13. The module 230 includes a plurality of signal electrical conductors 242 disposed in a linear array. More particularly, the signal conductors 242 are provided in a copper lead frame 246 (FIGS. 15A, 15B). The lead frame 246 is insert molded into the dielectric support 232 to form the structure shown in the right section of FIG. 13. When assembled, portions 249 of the lead frame 246 are cut away along edges 247 to provide electrically isolated conductors 242. Each one of the signal electrical conductors 242 has a forward, proximal end 248 made up of: a first concave-shaped electrical contact 250; and, a resilient, cantilever beam, interconnect 252 (FIG. 14C) suspending the contact 250 beyond a forward edge of the dielectric support 232. The contact 250 is adapted to have a forward portion 251 thereof engage the forward bevelled proximal end 68 (FIGS. 5 and 7) of a corresponding one of the plurality of signal electrical conductors 62 and bottom portions 253 thereof adapted to slide onto and electrically contact the central, elongated, upper rib portion 74 of the intermediate portion 70 of such corresponding one of the electrical signal conductors 62. That is, the raised, (i.e., upper), rib portion 74 has sufficient length to provide a full wipe along the bottom portion 253 of contact 250.

Each one of the signal electrical conductors 242 includes an intermediate portion 260 embedded in the dielectric support 232. Each one of such signal electrical conductors 242 is electrically insulated one from another by interposed portions of the dielectric support 232. A forward portion of the intermediate portion 260 is connected to the forward proximal end 248 of a corresponding one of the signals conductors 242. A rearward, distal end of each one of the signal electrical conductors 242 includes a signal mounting pad 262 and an arch-shaped interconnect 264 disposed between a rearward portion of the intermediate portion 260 and an edge 266 of the signal mounting pad 262. The interconnect 264 is resilient and suspends the signal mounting pad 262 at the edge 266 thereof beyond the surface portion of the dielectric support 232 in a region between the pair of rearward shoulder end portions 236 and in a nominal orientation substantially perpendicular to the dielectric support 232 and with an opposite edge 268 of the signal pad 262 freely suspended outwardly from the dielectric support 232. The mounting pads 262 are configured like the pads 80 and 104 are therefore adapted for soldering to surface mounting pads 300, 302 (FIGS. 17, 18) on the printed circuit board 18 (FIG. 1). Further, the pads are configured to accept "solder spheres", not shown, as on Ball Grid Array (BGA) packages. If desired, the spheres can be placed on the pad, and then fused to the pad using a surface mount solder reflow process. Further, pads 262 and 292 are suspended in opposite directions as shown in FIG. 16.

The module 230 includes an electrical shielding member 270 (FIG. 13). The electrical shielding member 270 includes a conductive, ground plane plate 272 disposed on the surface 240 of the dielectric support 232. The plate 272 has holes 273 stamped therein and such holes 273 are press-fit onto posts 275 molded, and projecting outwardly from, the surface 240, as shown in FIG. 13. The shielding member 270 includes a forward plurality of electrical reference potential conductors 282 having rearward proximal ends terminating along a forward edge of the plate 272. Each one of the forward plurality of reference potential conductors 282 includes a concave-shaped electrical contact 284 and a resilient, cantilever beam, interconnect 286 suspending the contact 284 beyond a forward edge of the dielectric support 232. During mating of connectors 12 and 14 contact 284 is adapted to make contact with beveled distal ends 96 of a corresponding one of the shielding members 84. the bottom portions 286 of the contacts 284 thereof slide onto and along the surface the conductive region 88 (FIGS. 9, 11, and 16).

Also, it should be noted that concave-shaped electrical contacts 250 are wider than signal electrical conductors 62. Thus, good electrical contact is made even if there is some misalignment between modules 42 and 230.

Figure 14A:
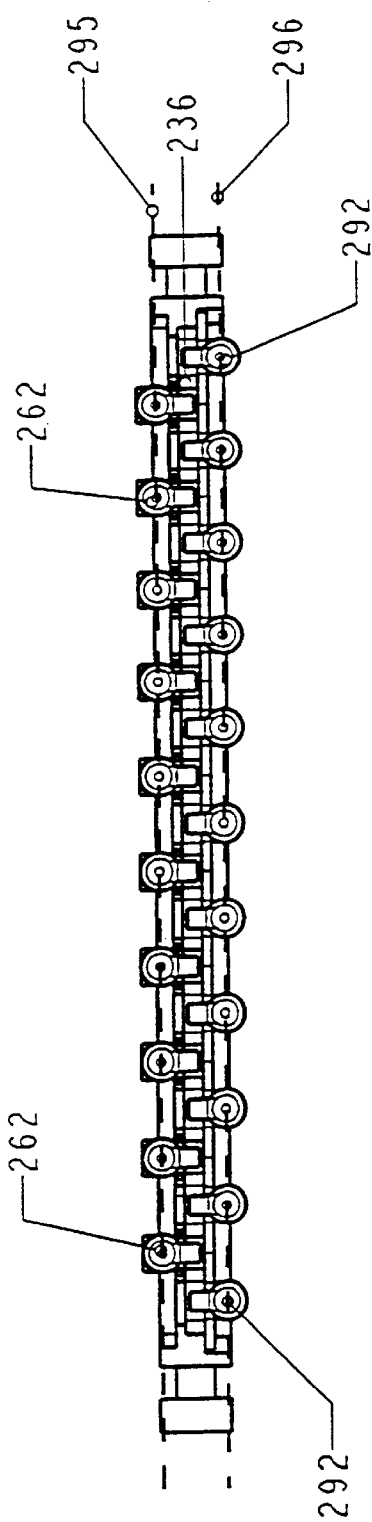
FIG. 14A is a diagrammatic sketch showing the arrangement of mounting pads of the module of FIG. 13.
Figure 14B:
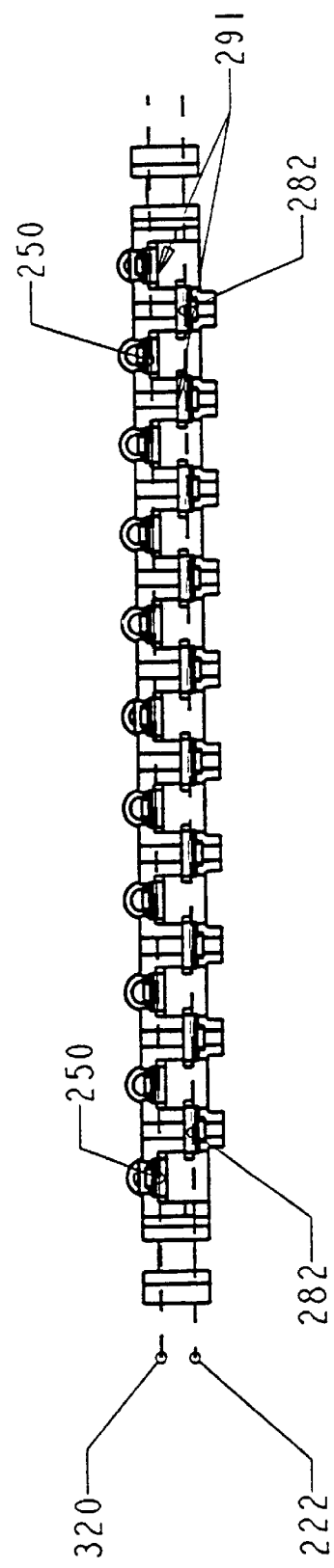
FIG. 14B is a diagrammatic sketch showing the arrangement of proximal ends of conductors of the module of FIG. 4.

The concave electrical contacts 250, 282 are staggered along the forward edge of the dielectric support 232, as shown in FIG. 14B, and have a gap 291 therebetween to receive the forward, edge of the dielectric support 44 of module 42, as shown in FIG. 16. Thus, contacts 250 are along line 320 and contacts 282 are along a parallel line 322, such lines 320, 322 being on opposite sides of dielectric support 232.

The shielding member 270 also includes a rearward plurality of electrical reference potential conductors 290. The electrical reference potential electrical conductors 290 have proximal ends terminating along a rearward edge of the plate, reference potential mounting pads 292, and reference potential arch-shaped interconnects 294 disposed between an edge of the reference potential mounting pads and the rearward edge of the plate 272. The reference potential arch-shaped interconnects 294 are resilient and suspending the reference potential mounting pads 292 at the edges thereof beyond said a rearward edge of the dielectric support 232 in a region between the pair of shoulder end portions 236 and in a nominal orientation substantially perpendicular to the dielectric support 232 with an opposite edge of the reference potential mounting pad being freely suspended outwardly from the second surface of the dielectric support 232 as with pads 80, 104 and 262. The plurality of reference potential mounting pads 292 are identical in construction as pads 80, 104 and 262. The signal mounting pads 262 are disposed along a line 295 parallel to the rearward edge of the dielectric support 236. The plurality of reference potential mounting pads 292 are disposed along a line 296 parallel to the rearward edge of the dielectric support 236. The lines 295, 296 are disposed on opposite sides of the dielectric support 236, as shown in FIG. 14A. The reference potential mounting pads 292 are staggered with the signal mounting pads 262.

Further, it should be noted that center portions of arch-shaped interconnects 82 and the center portions of arch-shaped interconnects 105 overlaying one another in region 297 (FIG. 16) to provide a degree of shielding of adjacent interconnects 82 (which are coupled to signal) in center portions of interconnects 105 (which are coupled to a reference potential, such as ground). In like manner, it is noted that center portions of arch-shaped interconnects 264 and the center portions of arch-shaped interconnects 294 overlaying one another in region 298 (FIG. 16) to provide a degree of shielding of adjacent interconnects 264 (which are coupled to signal) in center portions of interconnects 294 (which are coupled to a reference potential, such as ground).

As noted above, each of the interconnects 82, 105, 264 and 294 provides an inductor. It is also noted that the interconnects 82, 105, 264 and 294 also provide compliance to minimize mechanical stress on solder joints to the surface mounting pads 300, 302 (FIGS. 17, 18) by lowering the effective moment of inertia in the contact area.

Figure 14C:
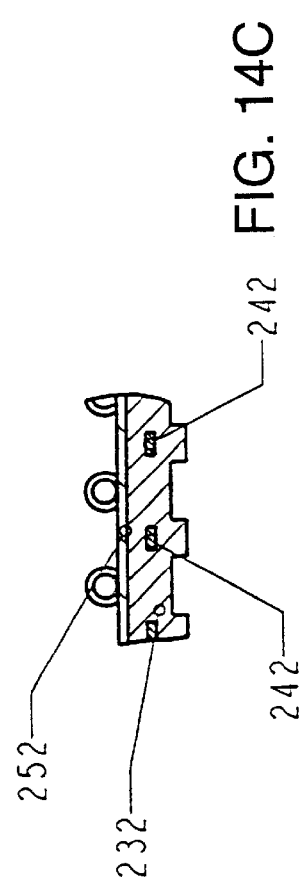
FIG. 14C is a cross-sectional sketch of a portion of the module of FIG. 4.
Figure 15A:
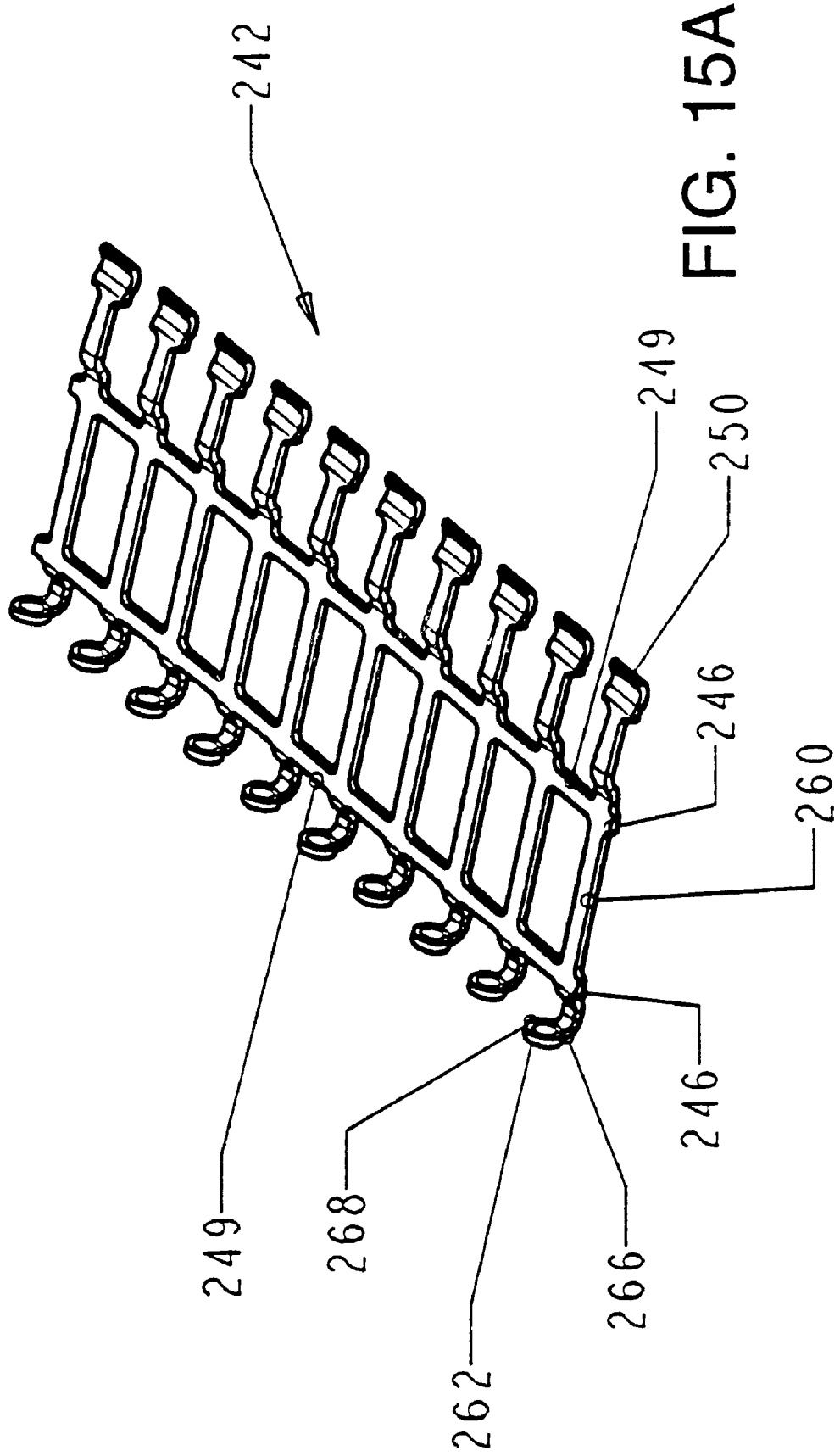
FIGS. 15A and 15B are different perspective views of a lead frame of signal electrical conductors used in the module of FIG. 13.
Figure 15B:
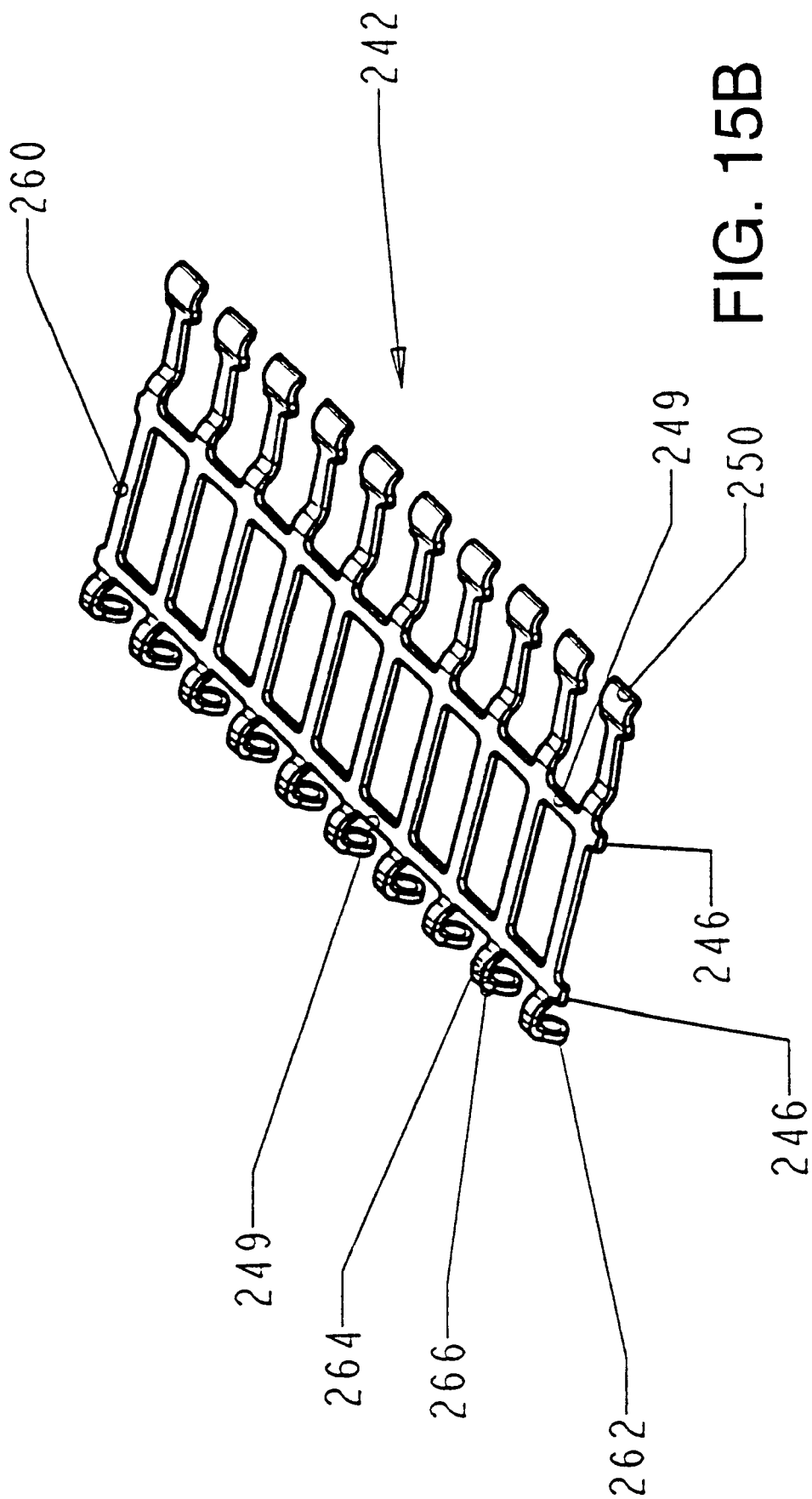

Referring to FIG. 14C, it is noted that the conductive plate 272 (FIG. 13), the portions of signal conductors 242 embedded in the dielectric support 232 disposed therebetween are configured as microstrip transmission lines having an input impedance, here 50 ohms.

It is also noted that when the modules 42 are disposed in housing 12, as shown in FIG. 2, the signal electrical conductors 62 and shielding member 84 are provided to mate with the signal electrical conductors 242 and contacts 284 of the modules 230 (FIG. 1) in housing 14, respectively, as shown in FIG. 16.

Figure 17:
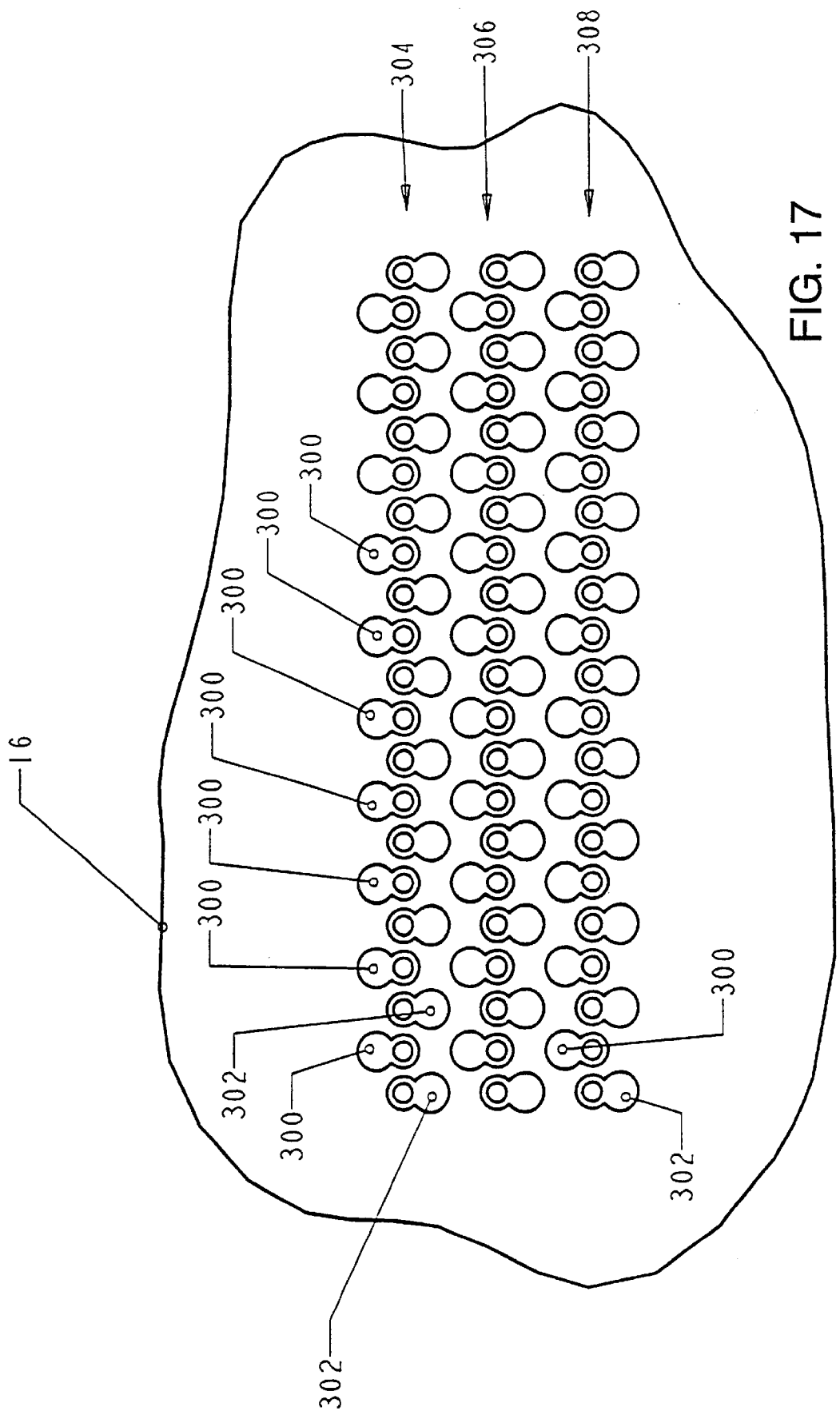
FIG. 17 is a top view of a portion of a printed circuit board having thereof a pad layout arranged for connection with one of the connectors of connector assembly of FIG. 1.
Figure 18:
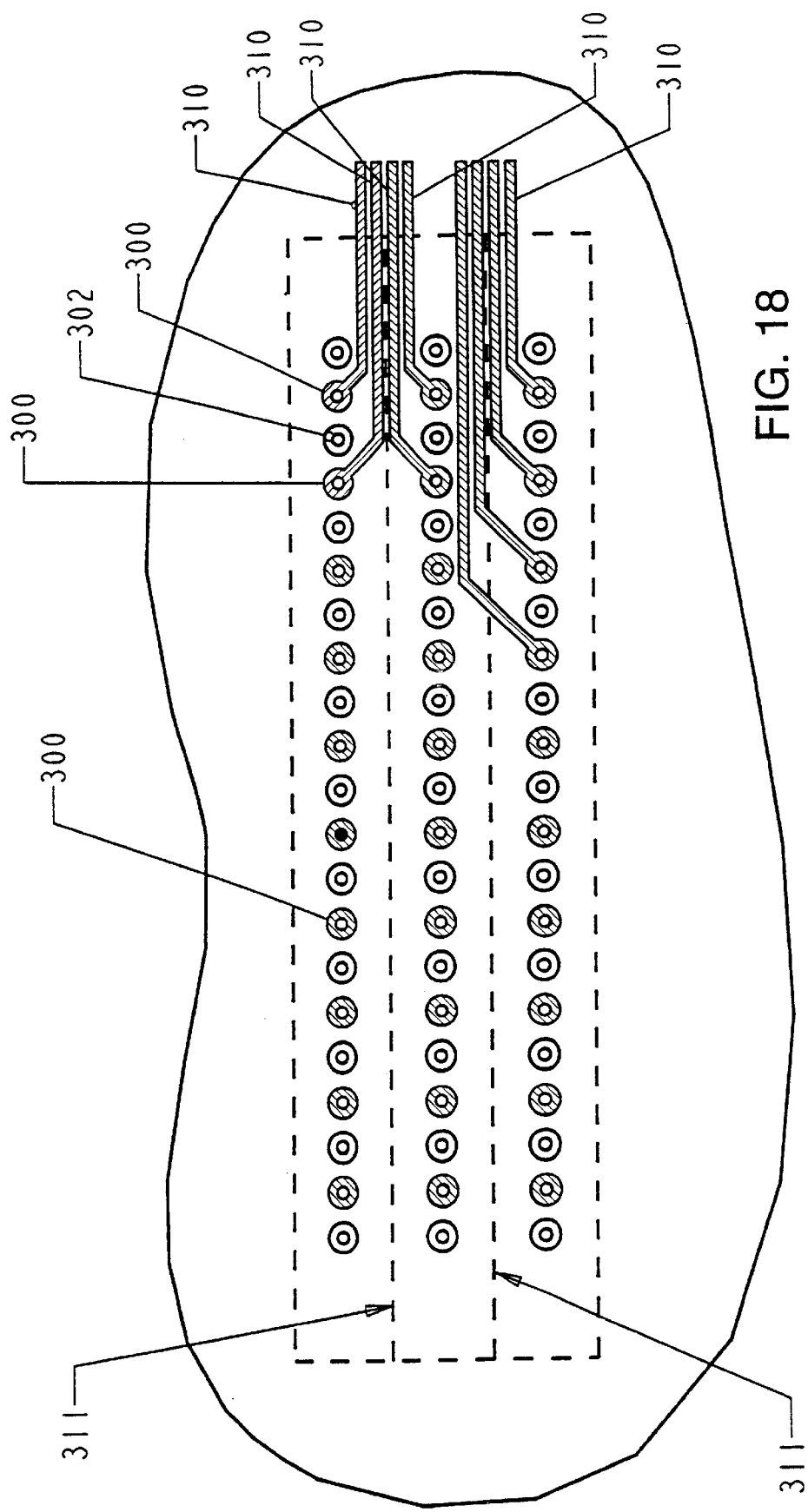
FIG. 18 is a diagrammatical sketch showing the arrangement of signal conductors used in the printed circuit board of FIG. 17.

Referring now to FIG. 17, a layout of signal contact surface mounting pads 300 and ground contact surface mounting pads 302 for an exemplary one of the printed circuit boards 16, 18, here board 16, is shown. Here, three rows 304, 306, 308, of contact surface mounting pads 300, 302 are shown. Between each pair of adjacent rows 304, 306, or 306, 308 are printed circuit board routing channels 311 (FIG. 18). It is noted that here there are four signal lines 310 in one layer of a printed circuit board which may be routed to the signal contact surface mounting pads 300. Thus, it is noted that both the signal contact pads and the ground contact pads are disposed along rows, with the signal contact pads being interleaved with the ground contact pads, as indicated.

It should be noted that the pads 80, 104, 262, and 292 are preferably of semi-circular shape to facilitate the attachment of solder spheres and sized accordingly such that the sphere forms a cylinder or bulging sphere when reflow solder to the printed circuit board bridging the space between the pad and the surface mount pad on the printed circuit board. The cylinder may take a canted shape to allow the pad/surface mount pad misalignment. However the conductors may optionally be coined on the underside to form a completely circular pad for attachment to the solder sphere reducing any tendency for the solder to wick up the conductor due to capillary action of solder wetting.

The shoulder ends of the modules are alignment indicia and have ears for retaining the modules in the housing. The housing, or shroud, transmits mating forces through the connectors 12 and 14 to boards 16 and 18, respectively. Thus, mating force shared by the housing or shroud and the solder joints. The modules are retained in the housings only at their ends providing a degree of compliance across the span between sidewalls and the housing. Whereas each module is individually retained, a degree of compliance or independence is also achieved from module to module. Additionally, the modules are retained in the direction across the shorter axis of the housing, parallel to the longitudinal axis of the housing to minimize any tendency to curt, or warp the housing as would be the case if the wafer were retained in the housing in the lengthwise, or elongated direction of the housing.

Other embodiments are within the spirit and scope of the appended claims. For example, it is described that wafers 42 and 230 are held in support members with tabs inserted into slots thereby forming an interference fit. Other attachment methods could be used. For example, a snap fit connection might be used or metal barbs might be employed to provide a more secure connection if needed.

Also, it was described that the contact elements have contact tails that are adapted for a surface mount connection. The connector might be made with contact tails suitable for press-fit or through-hole connection.

Moreover, the disclosed embodiment shows a mezzanine type connector in which the signal contacts extend straight through wafers 42 and 230. However, it would be possible to make a right angle type connector by bending the signal contacts at a right angle in region 260. Shield members 270 would likewise be modified to have contacts 282 on an edge that is perpendicular to the edge carrying rearward electrical connectors 290.

Further, in the preferred embodiment, all wafers in each connector portion are shown to be the same. However, such is not required. For example, some wafers might be adapted for carrying power. For a power wafer the conductors might be made wider to have a higher current carrying capacity or some of the conductors could be made of different lengths to provide a mate-first-break-last connection. Still further, differential wafers might be formed by jogging pairs of signal contacts closer together.

Further, the preferred embodiment has been described in which wafers are held together in a housing or shroud. A connector could be assembled without either or both pieces. For example, wafer 42 might be soldered directly to the printed circuit board 16 without the use of a shroud.

Moreover, it is pictured in the illustrated embodiment that all of the signal contacts in a wafer are evenly spaced. It might be advantageous to tailor the spacing between signal contacts to provide a desired level of performance. In particular, cross-talk associated with signal contacts at the end of a column is sometimes greater than the cross-talk associated with contacts at the center of a column. Thus, by increasing the spacing between the end contacts and the next nearest contact, the performance of the connector is more balanced-meaning that all contacts have similar performance.

It is not necessary that all portions of the end contacts be positioned farther from the adjacent signal contact. In some instances, it will be desirable to have the contact tails and the mating portions of the contacts on a uniform pitch. Thus, it is only the intermediate portions of the contacts that are offset. FIG. 19A illustrates this construction. Comparing FIG. 19A to FIG. 15A, the intermediate portion 260A of the signal contacts at the end of the column are spaced from the intermediate portion 260 at the end of the next nearest signal contact by a distance $D_2$. In contrast, the intermediate portions 260 in the center of the connector have a spacing of $D_1$. Here, $D_2$ is larger than $D_1$.

Nonetheless, FIG. 19A shows the spacing between pads 262 and contacts 250 is uniform. This arrangement is provided by jogs in the intermediate portions 260A.

FIG. 19B shows a similar jogged arrangement for the signal contacts in wafer 42. Comparing FIG. 7 to FIG. 19B, it can be seen that FIG. 19B illustrates an embodiment in which the intermediate portions of the end signal contacts are jogged away from the intermediate portion of the nearest signal contact.

Because a connector should be rated based on performance of the signal contact with the lowest performance tailoring the performance of one or two low performing signal contacts can increase the rated performance of the entire connector.

Also, it was described that the spacing between ground and signal contacts was selected to exactly match the impedance of signal traces in the printed circuit board. This spacing might be reduced to reduce cross-talk between adjacent signal conductors. Alternatively, the spacing might be adjusted to provide other impedances, which could be desired in other applications. The spacing, as well as the dimensions in the connector, will likely be set based on results of computer simulation and testing to provide performance levels suited for a given application.

As a still alternative, it is described that wafers are made with signal contacts on one side and ground contacts on the other. It might be desirable to have signal contacts on both sides of a wafer. Such a construction might be very useful for carrying differential signals.

Further, referring to FIG. 11, the end ones of the pads 104 and the interconnects 105 connected to such end pads 104 of shielding member 84 may be removed. Likewise, referring to FIG. 13, the end ones of the pads 292 and the interconnects 294 connected to such end pads 292 of shielding member 270 may be removed.

What is claimed is:

1. An electrical connector comprising:
    a housing having a plurality of parallel slots;
    a plurality of wafers, each of the plurality of wafers being configured to be received by one of the plurality of parallel slots of the housing;
    each of the plurality of wafers including a plurality of signal conductors, each of the plurality of signal conductors having an end portion;
    each of the plurality of wafers providing a reference potential through reference potential end portions;
    a solder ball connected to each of the signal conductor end portions and reference potential end portions, wherein the solder balls connected to the signal conductor end portions and the reference potential end portions lie along a common plane; and
    for each of the plurality of wafers, the signal conductor end portions are bent in a first direction such that the solder balls connected thereto are aligned along a first line, and the reference potential end portions are bent in a second direction, opposite from the first direction, such that the solder balls connected thereto are aligned along a second line.

2. The electrical connector of claim 1, wherein each of the plurality of wafers further comprises an insulative support securing the plurality of signal conductors, the insulative support having a first side and a second side.

3. The electrical connector of claim 2, wherein the signal conductor end portions for each of the plurality of wafers extend from the first side of the insulative support.

4. The electrical connector of claim 3, wherein each of the plurality of signal conductors further comprises a contact portion extending from the second side of the insulative support.

5. The electrical connector of claim 4, wherein the contact portion of each of the plurality of signal conductors comprises a compliant beam extending from the second side of the insulative support perpendicular to the common plane of the solder balls.

6. The electrical connector of claim 1, wherein for each of the plurality of wafers, the signal conductor end portions and the reference potential end portions are interleaved.

7. The electrical connector of claim 1, wherein the plurality of wafers are identical to one another.

8. The electrical connector of claim 1, wherein the first line and the second line are parallel.

9. An electrical connector assembly comprising:
    a first connector for mounting on a first printed circuit board, the first connector comprising:

a first housing having a plurality of parallel slots;

a plurality of first wafers, each of the plurality of first wafers being configured to be received by one of the plurality of parallel slots of the first housing;

each of the plurality of first wafers including a plurality of first signal conductors, each of the plurality of first signal conductors having an end portion and a contact portion;

each of the plurality of first wafers also including a first insulative support securing the plurality of first signal conductors, the first insulative support having a first side and a second side, wherein the first signal conductor end portions extend from the first side and the first signal conductor contact portions extend from the second side;

each of the end portions of the plurality of first signal conductors having a pad configured to accept a solder ball, wherein the solder balls connected to the first signal conductor end portions lie along a first plane; and for each of the plurality of first wafers, the first signal conductor end portions are bent such that the solder balls disposed thereon are aligned along a line;

a second connector for mounting on a second printed circuit board, the second connector mateable with the first connector, comprising:

a second housing having a plurality of parallel slots;

a plurality of second wafers, each of the plurality of second wafers being configured to be received by one of the plurality of parallel slots of the second housing;

each of the plurality of second wafers including a plurality of second signal conductors, each of the plurality of second signal conductors having an end portion and a contact portion;

each of the plurality of second wafers also including a second insulative support securing the plurality of second signal conductors, the second insulative support having a first side and a second side, wherein the second signal conductor end portions extend from the first side and the second signal conductor contact portions extend from the second side;

each of the end portions of the plurality of second signal conductors having a pad configured to accept a solder ball, wherein the solder balls connected to the second signal conductor end portions lie along a second plane; and for each of the plurality of second wafers, the second signal conductor end portions are bent such that the solder balls disposed thereon are aligned along a line.

10. The electrical connector assembly of claim 9, wherein:

each of the plurality of first wafers provides a reference potential through a plurality of first reference potential end portions and each of the plurality of second wafers provides a reference potential through a plurality of second reference potential end portions; and a solder ball connected to each of the first reference potential end portions and second reference potential end portions, wherein the solder balls connected to the first reference potential end portions lie along the first plane and the solder balls connected to the second reference potential end portions lie along the second plane.

11. The electrical connector assembly of claim 10, wherein for each of the plurality of first wafers, the first signal conductor end portions and the first reference potential end portions are interleaved.

12. The electrical connector assembly of claim 9, wherein the contact portion of each of the plurality of first signal conductors comprises a compliant beam extending from the second side of the first insulative support perpendicular to the first plane of the solder balls, and the contact portion of each of the plurality of second signal conductors comprises a compliant beam extending from the second side of the second insulative support perpendicular to the second plane of the solder balls.

13. The electrical connector assembly of claim 9, wherein the plurality of first wafers are identical to one another and the plurality of second wafers are identical to one another.

14. An electrical connector assembly comprising:

a first connector for mounting on a first printed circuit board, the first connector comprising:

a plurality of first wafers, each of the first wafers having a first insulative support and a plurality of first conductive members secured therein, each of the first conductive members having an end portion extending from the first insulative support and a contact portion extending from the first insulative support;

each of the end portions of the plurality of first conductive members having a pad configured to accept a first solder ball; and wherein the first wafers are aligned in parallel, the first solder balls lie in a first plane and the contact portions of the first conductive members are perpendicular to the first plane;

a second connector for mounting on a second printed circuit board, the second connector mateable with the first connector, comprising:

a plurality of second wafers, each of the second wafers having a second insulative support and a plurality of second conductive members secured therein, each of the second conductive members having an end portion extending from the second insulative support and a contact portion extending from the second insulative support;

each of the end portions of the plurality of second conductive members having a pad configured to accept a second solder ball; and wherein the second wafers are aligned in parallel, the second solder balls lie in a second plane and the contact portions of the second conductive members are perpendicular to the second plane.

15. The electrical conector assembly of claim 14, wherein the first wafers are identical to one another and the second wafers are identical to one another.

* * * * *